(12) United States Patent
Muragishi et al.

(10) Patent No.: US 8,349,736 B2
(45) Date of Patent: Jan. 8, 2013

(54) SEMICONDUCTOR DEVICE MANUFACTURING METHOD AND SEMICONDUCTOR DEVICE

(75) Inventors: Isao Muragishi, Osaka (JP); Kai Takayuki, Kyoto (JP); Saito Daishiro, Toyama (JP); Daisuke Yamamoto, Okayama (JP); Takeshi Koiwasaki, Toyama (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/384,015

(22) PCT Filed: Feb. 17, 2011

(86) PCT No.: PCT/JP2011/000864
§ 371 (c)(1),
(2), (4) Date: Jan. 13, 2012

(87) PCT Pub. No.: WO2011/111308
PCT Pub. Date: Sep. 15, 2011

(65) Prior Publication Data
US 2012/0115323 A1 May 10, 2012

(30) Foreign Application Priority Data
Mar. 9, 2010 (JP) ................................. 2010-051516

(51) Int. Cl.
*H01L 21/44* (2006.01)
(52) U.S. Cl. ......... 438/667; 438/637; 438/672; 438/675
(58) Field of Classification Search .................. 438/637, 438/638, 650, 666, 667, 672, 675, 686
See application file for complete search history.

(56) References Cited

U.S. PATENT DOCUMENTS

| | | | | |
|---|---|---|---|---|
| 6,809,421 | B1 * | 10/2004 | Hayasaka et al. | 257/777 |
| 7,199,050 | B2 * | 4/2007 | Hiatt | 438/667 |
| 7,300,857 | B2 * | 11/2007 | Akram et al. | 438/459 |
| 2005/0151228 | A1 * | 7/2005 | Tanida et al. | 257/620 |
| 2007/0029654 | A1 | 2/2007 | Sunohara et al. | |
| 2007/0166957 | A1 | 7/2007 | Kameyama et al. | |
| 2007/0284729 | A1 | 12/2007 | Kwon et al. | |

FOREIGN PATENT DOCUMENTS

| | | |
|---|---|---|
| GB | 2 285 174 | 6/1995 |
| JP | 7-193214 | 7/1995 |
| JP | 2003-273107 | 9/2003 |
| JP | 2007-42741 | 2/2007 |
| JP | 2007-180395 | 7/2007 |
| JP | 2007-318143 | 12/2007 |

OTHER PUBLICATIONS

International Search Report issued May 24, 2011 in International (PCT) Application No. PCT/JP2011/000864.

* cited by examiner

*Primary Examiner* — Kevin M Picardat
(74) *Attorney, Agent, or Firm* — Wenderoth, Lind & Ponack, L.L.P.

(57) ABSTRACT

A base conductive member is formed on a surface and in a hole section of a substrate, and a resist is formed on a part of the base conductive member in which a conductive layer is not to be formed. The conductive layer is formed on a part except for the part in which the resist has been formed, and a mask metal is formed on the conductive layer. Then, the resist is removed, and the base conductive member is etched using the mask metal as a mask to form the conductive layer into a predetermined shape.

4 Claims, 20 Drawing Sheets

Fig.3

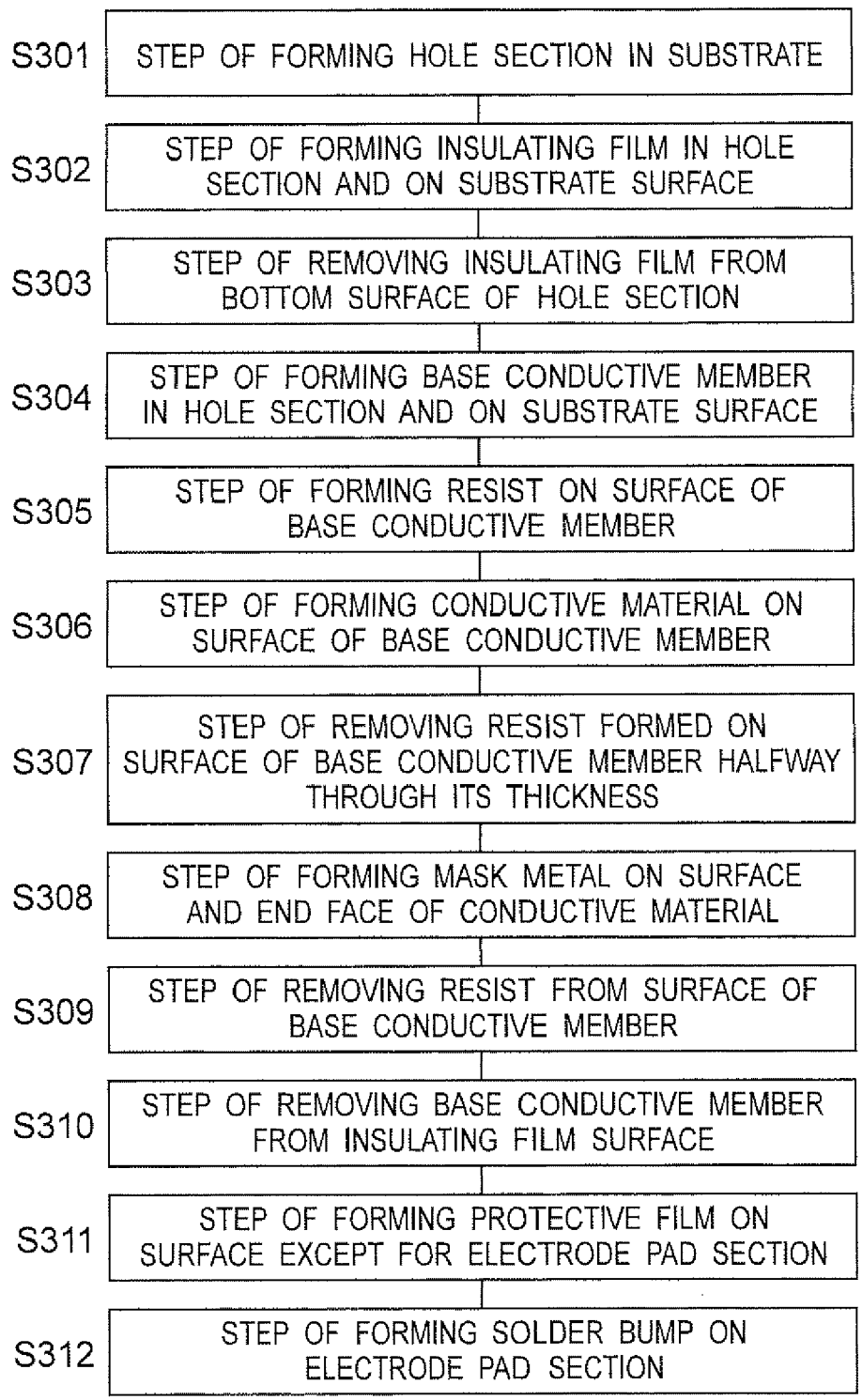

| S301 | STEP OF FORMING HOLE SECTION IN SUBSTRATE |
| S302 | STEP OF FORMING INSULATING FILM IN HOLE SECTION AND ON SUBSTRATE SURFACE |
| S303 | STEP OF REMOVING INSULATING FILM FROM BOTTOM SURFACE OF HOLE SECTION |
| S304 | STEP OF FORMING BASE CONDUCTIVE MEMBER IN HOLE SECTION AND ON SUBSTRATE SURFACE |
| S305 | STEP OF FORMING RESIST ON SURFACE OF BASE CONDUCTIVE MEMBER |
| S306 | STEP OF FORMING CONDUCTIVE MATERIAL ON SURFACE OF BASE CONDUCTIVE MEMBER |
| S307 | STEP OF REMOVING RESIST FORMED ON SURFACE OF BASE CONDUCTIVE MEMBER HALFWAY THROUGH ITS THICKNESS |
| S308 | STEP OF FORMING MASK METAL ON SURFACE AND END FACE OF CONDUCTIVE MATERIAL |
| S309 | STEP OF REMOVING RESIST FROM SURFACE OF BASE CONDUCTIVE MEMBER |
| S310 | STEP OF REMOVING BASE CONDUCTIVE MEMBER FROM INSULATING FILM SURFACE |
| S311 | STEP OF FORMING PROTECTIVE FILM ON SURFACE EXCEPT FOR ELECTRODE PAD SECTION |
| S312 | STEP OF FORMING SOLDER BUMP ON ELECTRODE PAD SECTION |

SEMICONDUCTOR DEVICE MANUFACTURING METHOD AND SEMICONDUCTOR DEVICE

TECHNICAL FIELD

The present invention relates to a manufacturing method of a semiconductor device to produce a semiconductor chip or a Si interposer used in a three-dimensional packaging technique to laminate a plurality of semiconductor chips and wire the semiconductor chips, and to the semiconductor device.

BACKGROUND ART

In tandem with reduction in size and weight of an electronic device, various electronic components such as a semiconductor chip provided in the electronic device are miniaturized. In addition, a space for packaging the electronic component is extremely limited due to the miniaturization. In addition, in order to further miniaturize and increase the number of functions in the future, it is necessary to increase a package density of a semiconductor chip. Under such circumstances, a three-dimensional packaging technique has been devised.

According to the three-dimensional packaging technique, a plurality of semiconductor chips are laminated and the semiconductor chips are wired to realize high-density packaging of the semiconductor.

In the three-dimensional packaging technique, the semiconductor chip or a Si interposer to connect the semiconductor chip to a substrate has a following electrode structure. That is, the semiconductor chip or the Si interposer has a connecting terminal and an electrode pad section for external connection, on its front and back surfaces. The semiconductor chip or the Si interposer has a conductive member in its inside and a through hole penetrating through the front and back surfaces of the semiconductor chip. The connecting terminal and the electrode pad section are electrically connected through the conductive member formed in the through hole.

Thus, the semiconductor chips, the Si interposers, or the semiconductor chip and the Si interposer each having the above electrode structure are laminated. Thus, the connecting terminal or the electrode pad section formed on the back surface of the semiconductor chip is connected to the connecting terminal or the electrode pad section formed on the front surface of another semiconductor chip. Through this connection, the semiconductor chips or the substrates are wired.

The semiconductor chip or the Si interposer used in the three-dimensional packaging technique is produced through many steps. For example, a conventional method for forming the connecting terminal or the electrode pad for the external connection, and the through hole is implemented by following steps as shown in Patent Literature 1. First, the through hole is filled with a conductive member, and the whole surface of the semiconductor chip or the Si interposer is covered with a resist pattern. Then, the conductive member except for a part on which the connecting terminal or the electrode pad is to be formed is removed by wet-etching, and the connecting terminal or the electrode pad is formed.

FIG. 5 is a flowchart of steps of manufacturing a semiconductor device according to Patent Document 1. FIGS. 6A to 6F are each a cross-sectional view showing a state of the semiconductor device in each step in a manufacturing method of the semiconductor device according to Patent Document 1.

FIG. 6A shows a cross-sectional state of the semiconductor device after five steps have been performed. The five steps include, as shown in FIG. 5, a step of forming a hole in a substrate in a step (S501), a step of forming an insulating film in the hole and on a surface of the substrate in a step (S502), a step of removing the insulating film from the surface of the substrate and a bottom surface of the hole in a step (S503), a step of forming a base conductive member in the hole and on the surface of the substrate in a step (S504), and after the steps are completed, a step of forming a resist on a surface of the base conductive member in a step (S505).

Referring to FIG. 6A, an insulating film 501 is formed on a wall surface of a hole 503 formed in a substrate 502. A base conductive member 504 is formed so as to cover an inside of the hole 503, and an upper part of the substrate 502. A resist 505 is applied and patterned to be formed on a surface of the base conductive member 504.

FIG. 6B shows a cross-sectional state of the semiconductor device after a conductive layer 506 has been formed on the surface of the base conductive member 504 in a step (S506) in FIG. 5. The conductive layer 506 to become the connecting terminal and the electrode pad section is formed on the base conductive member 504 as the basis.

FIG. 6C shows a cross-sectional state of the semiconductor device after the resist 505 has been removed from the surface of the base conductive member 504 in a step (S507) in FIG. 5. The resist 505 is removed and a groove 507 is formed, whereby the conductive layer 506 is divided into a conductive layer 506A to become the connecting terminal or the electrode pad section, and a conductive layer 508 serving as the rest except for the conductive layer 506A.

FIG. 6D shows a cross-sectional state of the semiconductor device after a resist 509 to cover the conductive layer 506A to become the connecting terminal or the electrode pad section has been formed in a step (S508) in FIG. 5.

FIG. 6E shows a cross-sectional state of the semiconductor device after the conductive layer 508 has been removed except for the conductive layer 506A to become the connecting terminal or the electrode pad section in a step (S509) in FIG. 5. The conductive layer 508 is removed by wet-etching except for the conductive layer 506A to become the connecting terminal or the electrode pad section. During the removal, since the conductive layer 506A to become the connecting terminal or the electrode pad section is covered with the resist 509, the conductive layer 506A is protected and can be prevented from being eroded by a wet-etching solution.

FIG. 6F shows a cross-sectional state of the semiconductor device after the base conductive member 504 has been removed except for the conductive layer 506A to become the connecting terminal or the electrode pad section in a step (S510) in FIG. 5, and the resist covering the part to become the connecting terminal or the electrode pad section has been removed in a step (S511). The base conductive member 504 is removed except for the conductive layer 506A to become the connecting terminal or the electrode pad section in the step (S510) in FIG. 5, and the resist 509 covering the conductive layer 506A to become the connecting terminal or the electrode pad section is removed, whereby the conductive layer 506A of the connecting terminal or the electrode pad is formed.

Then, through a step of forming a mask metal on the electrode pad section in a step (S512) in FIG. 5, a step of forming a protective film on a surface except for the electrode pad section in a step (S513), and a step of forming a solder bump on the electrode pad section in a step (S513), the solder bump is formed on the electrode pad section (not shown).

However, as described with reference to FIG. 6E, there is an issue in the conventional method to prevent erosion due to the wet-etching solution used in the post-step by covering the connecting terminal or the electrode pad section with the resist. That is, the issue in the conventional method is that it is necessary to add a photolithography step to cover only the connecting terminal and the electrode pad section with the resist. Thus, the resist material is needed and the step is increased, which causes production cost to increase.

In addition, the resist could flow into a narrow gap between the connecting terminal or the electrode pad section and a part other than the connecting terminal or the electrode pad section. This resist is very hard to remove later, so that the resist residue could cause quality to decline.

In addition, as shown in FIG. 6B, in the case where a thickness of the conductive layer 506 is small, a recessed shape is generated in a center of the hole 503. When the conductive layer 506 having the recessed shape is covered with the resist to prevent erosion due to the wet-etching solution used in the post-step, the resist could flow into an inner part of the conductive layer having the recessed shape. This resist is hard to remove later, so that the resist residue could cause quality to decline.

CITATION LIST

Patent Literature

Patent Literature 1: Japanese Unexamined Patent Publication No. 2003-273107

SUMMARY OF THE INVENTION

Technical Problem

The conventional issue to be resolved by the present invention is that the new step is needed, and quality declines due to the resist residue. It is an object of the present invention to provide a manufacturing method of a semiconductor device in which a new step is not needed, and quality does not decline due to a resist residue, and to provide the semiconductor device.

Solution to Problem

The present invention is configured as follows to attain the above object.

A manufacturing method of a semiconductor device according to one aspect of the present invention, there is provided a semiconductor device manufacturing method comprising:

forming a base conductive member on a surface of a substrate, and in a hole section formed in the substrate;

forming a resist on a part of the base conductive member;

forming a conductive layer on a part except for a part at which the resist is formed;

forming a mask metal for etching on the conductive layer after the conductive layer has been formed;

removing the resist; and etching the base conductive member using the mask metal as a mask to form the conductive layer into a predetermined shape.

In addition, a semiconductor device according to another aspect of the present invention to attain the above object comprises a substrate having a hole section, a base conductive member formed on a surface of the substrate and in the hole section formed in the substrate, a conductive layer formed on the base conductive member, and a metal layer serving as a mask metal formed on the conductive layer.

EFFECTS OF THE INVENTION

According to the present invention, in the manufacturing method of the semiconductor device, a new step is not needed, and quality is prevented from declining due to a resist residue. In addition, in the semiconductor device, adhesiveness and conductivity of the conductive layer can be improved.

BRIEF DESCRIPTION OF THE DRAWINGS

Features of the present invention will become apparent from the following description in connection with embodiments taken in conjunction with the accompanying drawings, in which:

FIG. 3 is a flowchart of steps of manufacturing a semiconductor device according to a second embodiment of the present invention;

DESCRIPTION OF EMBODIMENTS

Figure 1:
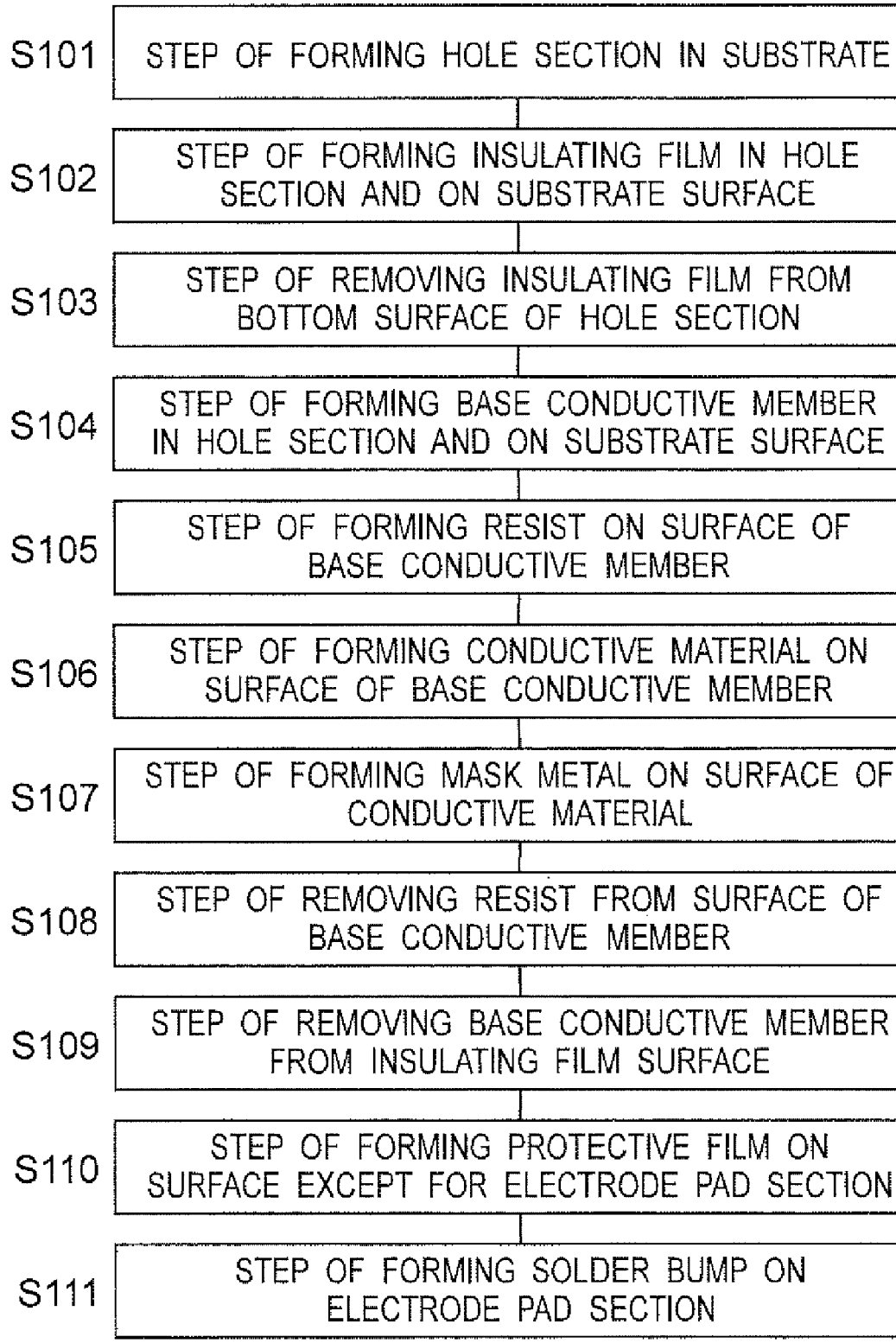
FIG. 1 is a flowchart of steps of manufacturing a semiconductor device according to a first embodiment of the present invention.

Before the description of the present invention proceeds, it is to be noted that like parts are designated by like reference numerals throughout the accompanying drawings.

Hereinafter, embodiments of the present invention will be described with reference to the drawings.

(First Embodiment)

FIG. 1 is a flowchart of steps of manufacturing a semiconductor device according to a first embodiment of the present invention. Each view shown in FIGS. 2A to 2R is a cross-sectional view or a plan view showing a state of the semiconductor device in each manufacturing step in this first embodiment.

Figure 2A:
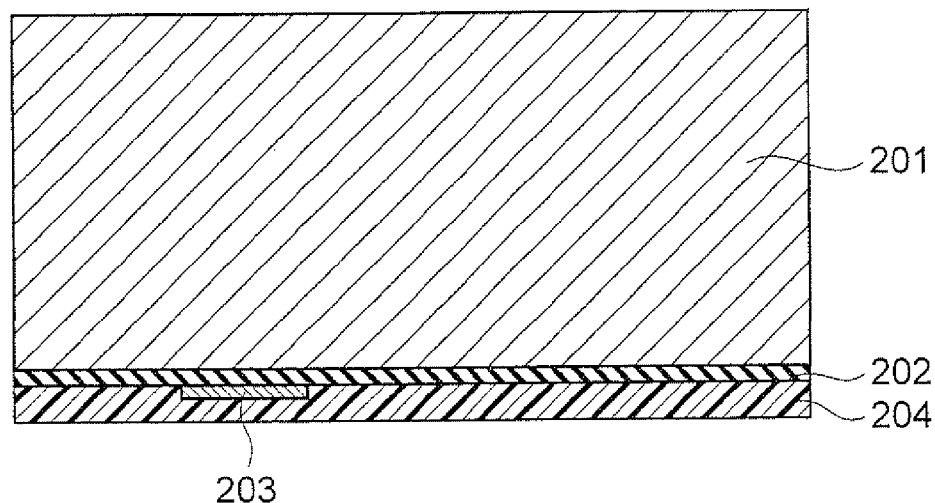
FIG. 2A is a cross-sectional view showing a state of the semiconductor device in a step of manufacturing the semiconductor device according to the first embodiment of the present invention.

Referring to FIG. 2A, an insulating film 202 is formed on a back surface of a substrate 201. A conductive member 203 and a protective film 204 to protect the conductive member 203 are formed on a back surface of the insulating film 202 (lower surface side in FIG. 2A). As the substrate 201, a Si substrate is used, for example. As the insulating film 202, a $SiO_2$ film is used, for example. As the conductive member 203, Cu is used, for example. As the protective film 204, polyimide is used, for example.

Figure 2B:
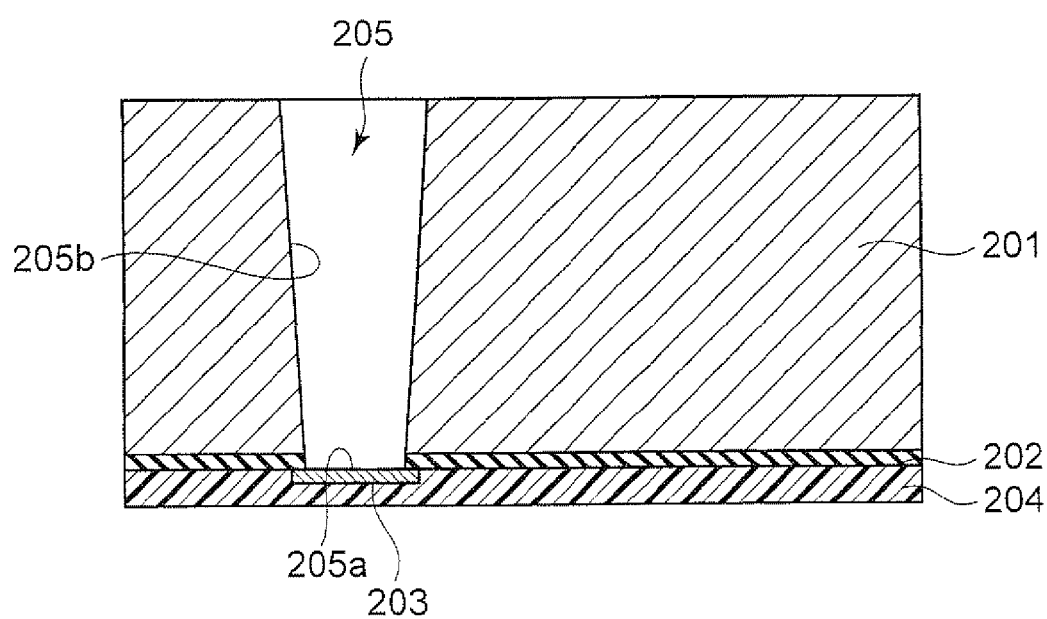
FIG. 2B is a cross-sectional view showing a state of the semiconductor device in a step of manufacturing the semiconductor device according to the first embodiment of the present invention.

FIG. 2B shows a cross-sectional shape of the semiconductor device after a hole section 205 has been formed in the substrate 201 in a step (S101) in FIG. 1. The hole section 205 is a hole provided so as to penetrate through the substrate 201 from a surface of the substrate 201. The hole section 205 is formed by dry-etching after a resist agent has been applied to the surface of the substrate 201 (upper surface in FIG. 2A) and patterned to form a resist (not shown). The hole section 205 is configured such that the conductive member 203 is exposed to an opening of a bottom surface 205a. Therefore, the opening of the bottom surface 205a of the hole section 205 is formed so as to be smaller in size than the conductive member 203. As a specific example of a material of the resist, a novolac resin can be used. A photosensitizing agent is added in the novolac resin.

According to a working example of the first embodiment, the hole section 205 has a diameter of 50 μm to 100 μm and penetrates through the substrate 201 having a thickness of 100 μm.

Figure 2C:
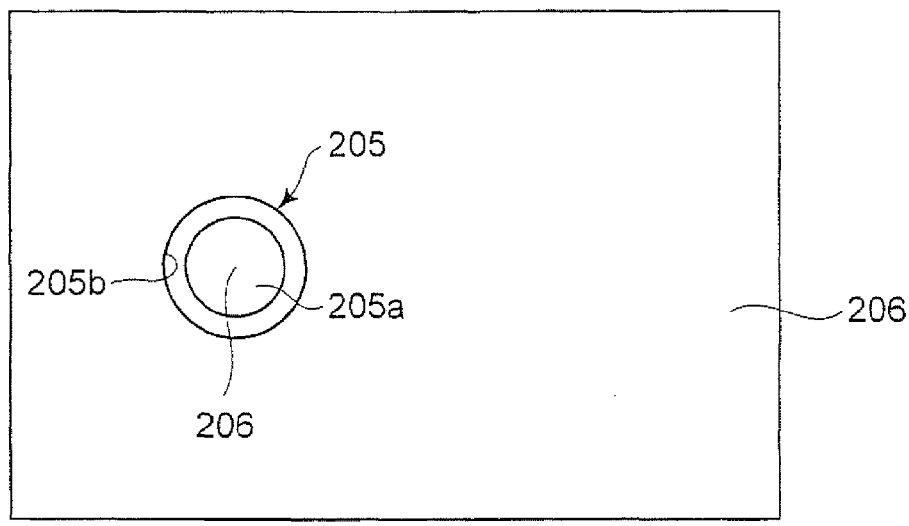
FIG. 2C is a plan view showing a state of the semiconductor device in FIG. 2D in a step of manufacturing the semiconductor device according to the first embodiment of the present invention.
Figure 2D:
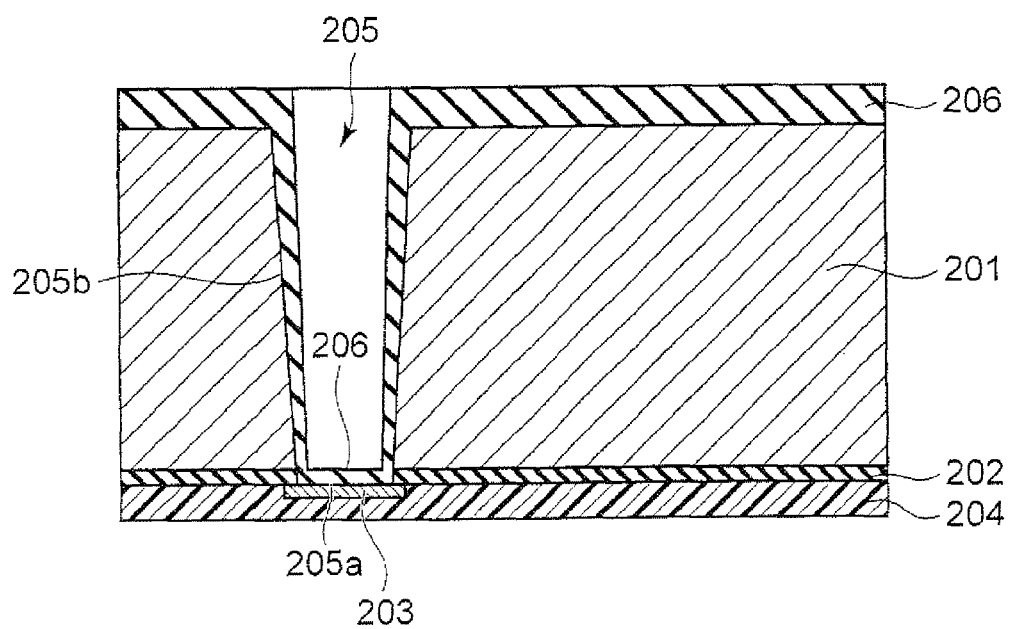
FIG. 2D is a cross-sectional view showing the state of the semiconductor device in the step of manufacturing the semiconductor device according to the first embodiment of the present invention.

FIGS. 2C and 2D show cross-sectional shapes of the semiconductor device after an insulating film has been formed in the hole section 205 and on the surface of the substrate 201, in a step (S102) in FIG. 1. An insulating film 206 is formed so as to cover the conductive member 203 exposed to the opening of the bottom surface 205a of the hole section 205, an inner wall 205b of the hole section 205, and the surface of the substrate 201.

According to the working example of the first embodiment, a SiO$_2$ film having a thickness of 2 µm is formed as the insulating film 206 on the surface of the substrate 201 by CVD. In addition, the insulating film 206 of the SiO$_2$ film is formed so as to be 1 µm in thickness on a surface of the conductive member 203 exposed to the opening of the bottom surface 205a of the hole section 205, and formed to be 0.5 µm in thickness on the inner wall 205b of the hole section 205.

According to the working example of the first embodiment, the insulating film 206 is formed by the CVD which can form the insulating film at high speed. In addition, although the film forming speed becomes slow, the insulating film can be similarly formed by sputtering instead of the CVD.

Figure 2E:
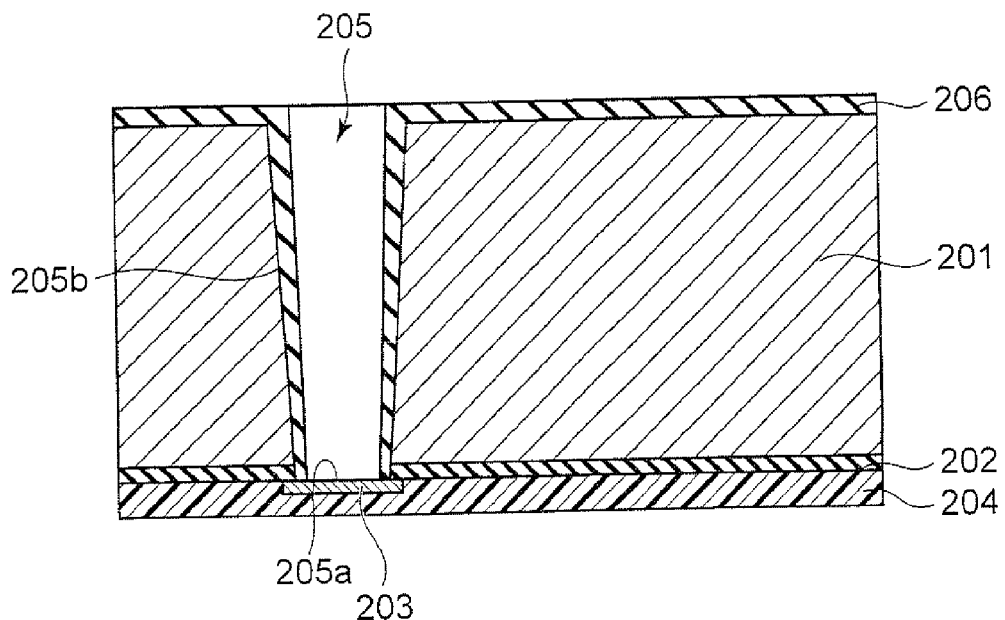
FIG. 2E is a cross-sectional view showing a state of the semiconductor device in a step of manufacturing the semiconductor device according to the first embodiment of the present invention.

FIG. 2E shows a cross-sectional state of the semiconductor device after the insulating film 206 on the bottom surface 205a of the hole section 205 has been removed in a step (S103) in FIG. 1. The insulating film 206 is removed from the surface of the conductive member 203 exposed to the opening of the bottom surface 205a of the hole section 205.

At this time, according to the first embodiment, the insulating film 206 is removed by dry-etching. Since the removal is executed without forming a resist, the insulating film 206 formed on the surface of the substrate 201 is partially removed at the same time. However, according to the first embodiment, the insulating film 206 formed on the surface of the substrate 201 is thicker than that of the insulating film 206 formed on the conductive member 203, so that even after the insulating film 206 has been removed from the surface of the conductive member 203, the insulating film 206 remains. For example, according to the above working example, the insulating film 206 having a thickness of 1 µm remains on the surface of the conductive member 203. In addition, the inner wall 205b of the hole section 205 is hardly etched by the dry-etching, so that the insulating film 206 on the inner wall 205b has the same thickness before the dry etching step. For example, according to the above working example, the insulating film 206 having the thickness of 0.5 µm remains on the inner wall 205b.

Figure 2F:
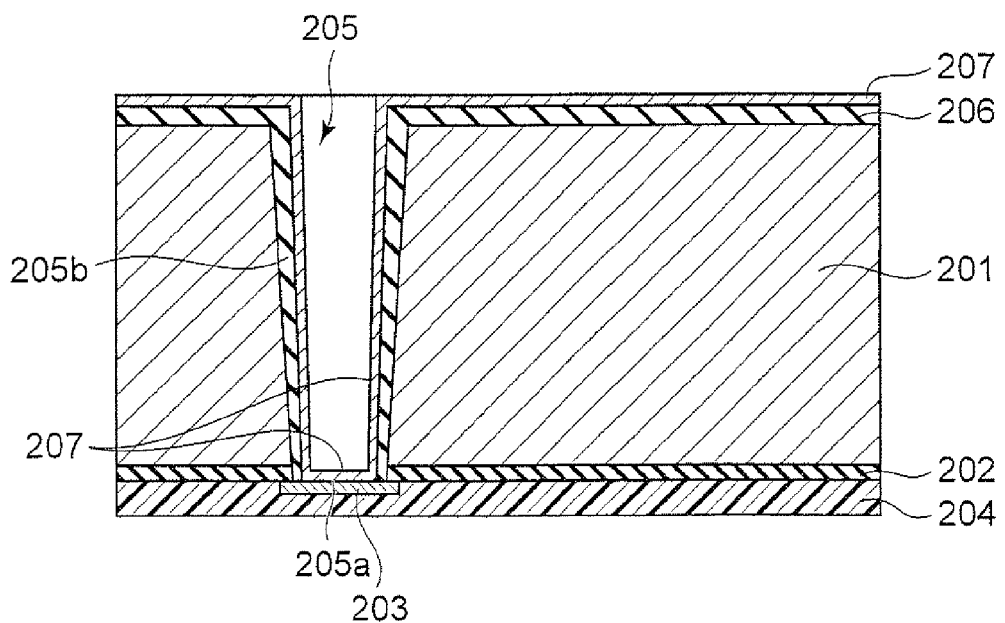
FIG. 2F is a cross-sectional view showing a state of the semiconductor device in a step of manufacturing the semiconductor device according to the first embodiment of the present invention.
Figure 2G:
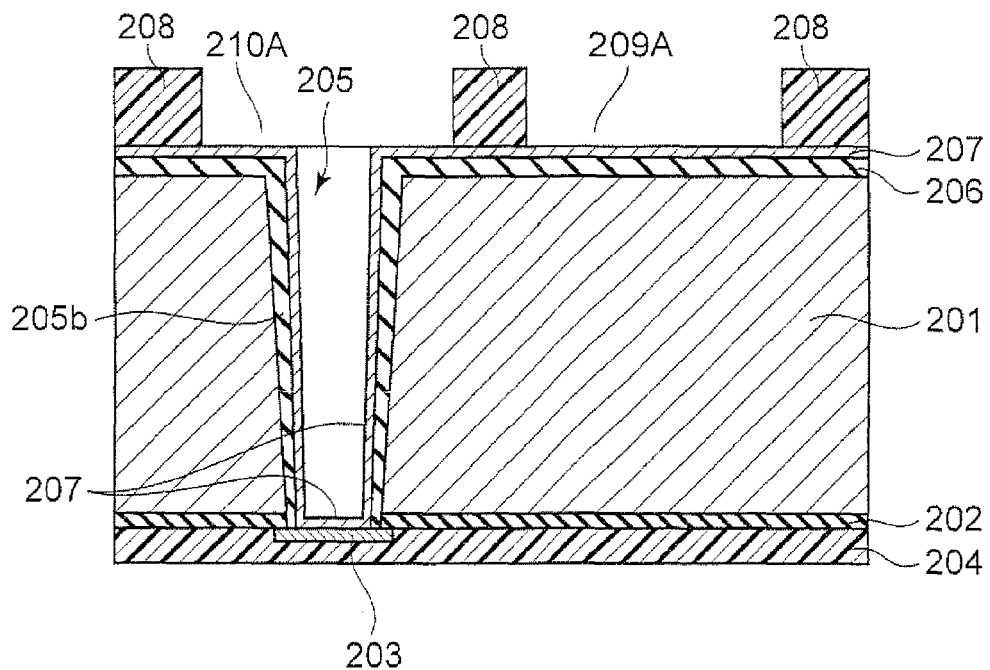
FIG. 2G is a cross-sectional view showing a state of the semiconductor device in a step of manufacturing the semiconductor device according to the first embodiment of the present invention.
Figure 2H:
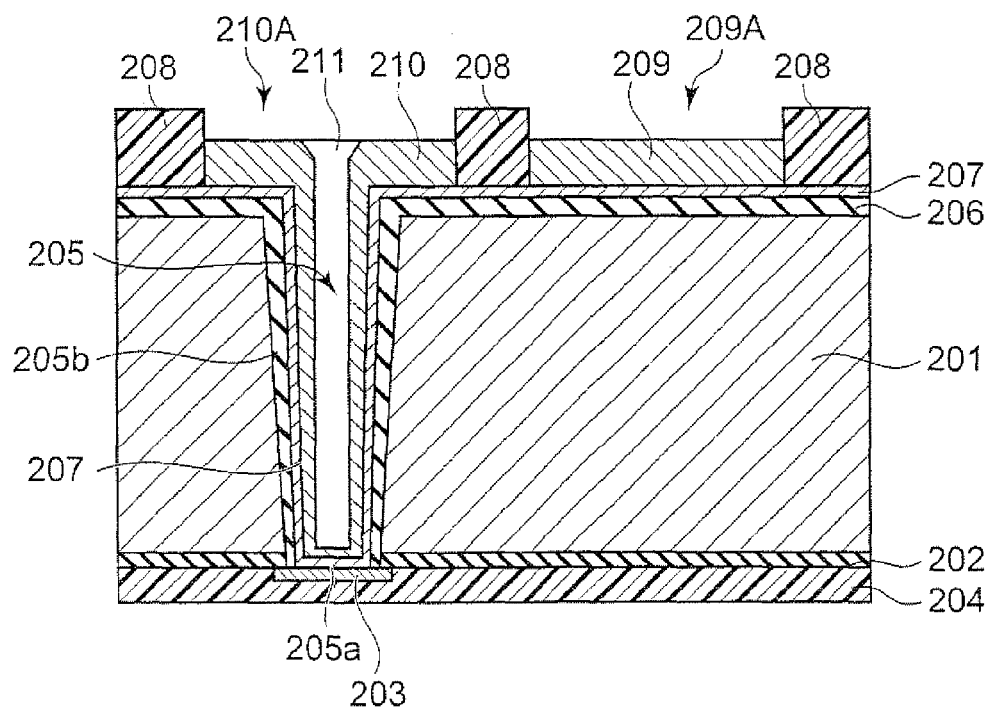
FIG. 2H is a cross-sectional view showing a state of the semiconductor device in a step of manufacturing the semiconductor device according to the first embodiment of the present invention.
Figure 2I:
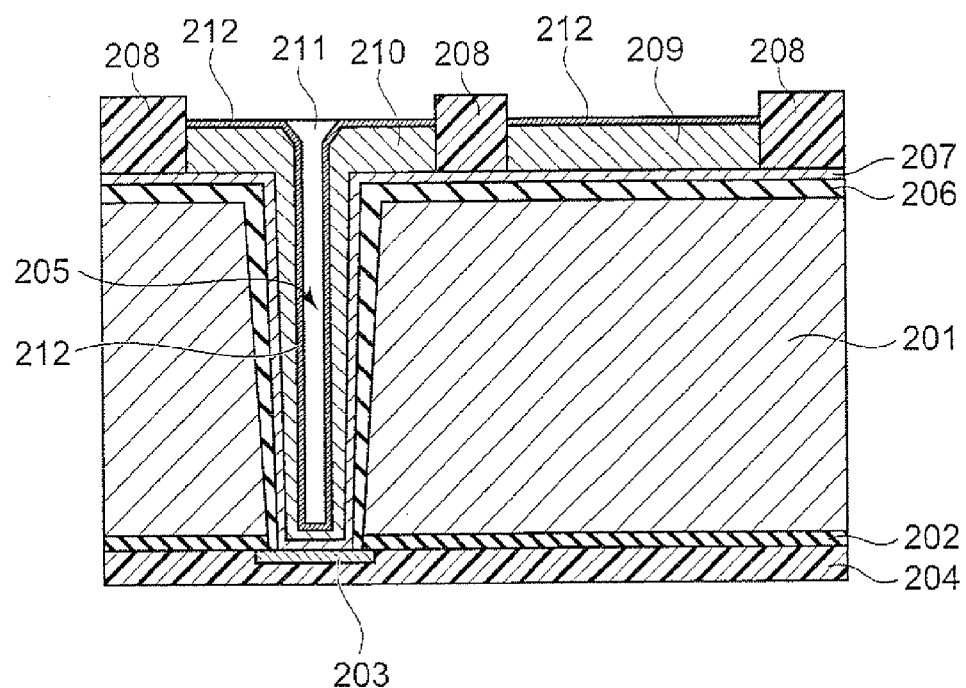
FIG. 2I is a cross-sectional view showing a state of the semiconductor device in a step of manufacturing the semiconductor device according to the first embodiment of the present invention.
Figure 2J:
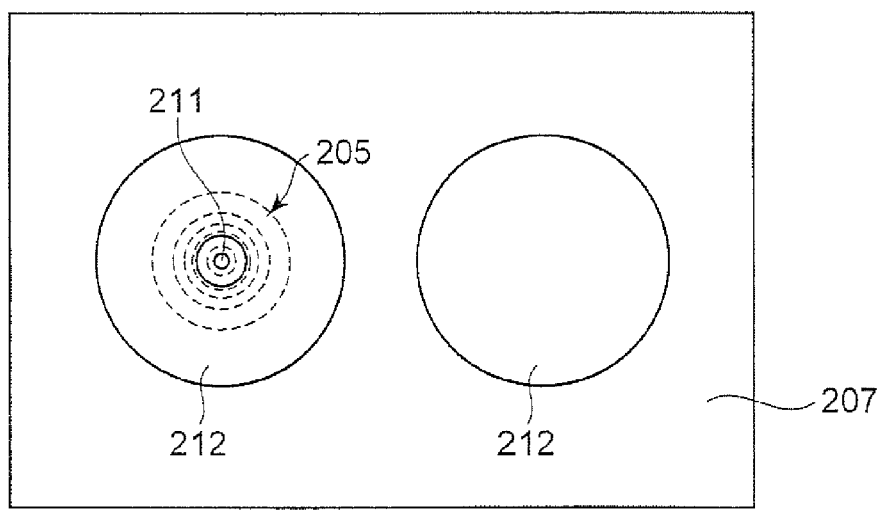
FIG. 2J is a plan view showing a state of the semiconductor device in FIG. 2K in a step of manufacturing the semiconductor device according to the first embodiment of the present invention.
Figure 2K:
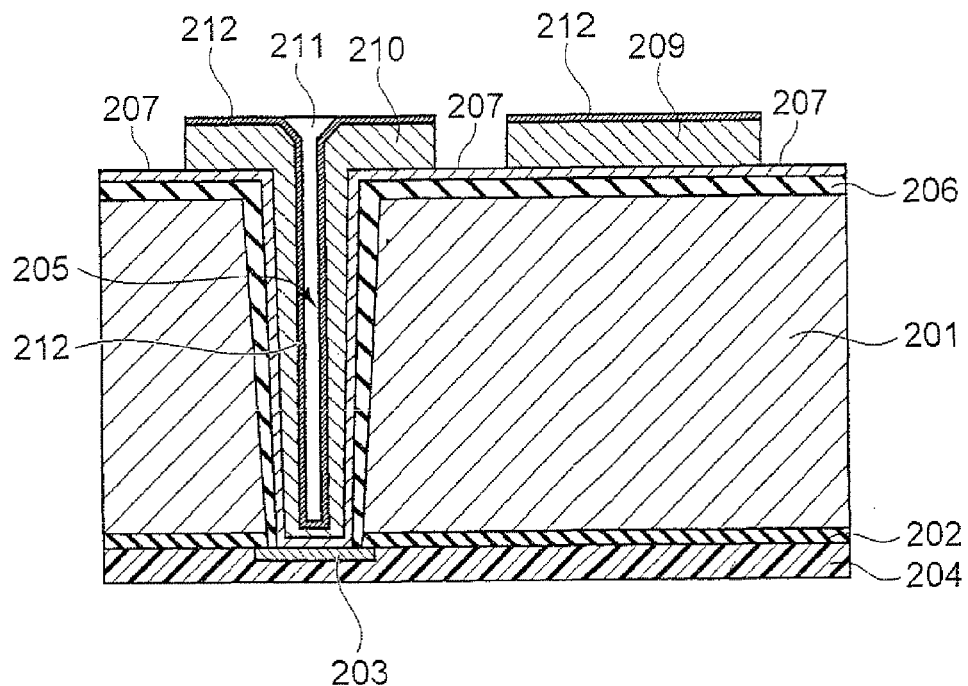
FIG. 2K is a cross-sectional view showing the state of the semiconductor device in the step of manufacturing the semiconductor device according to the first embodiment of the present invention.
Figure 2L:
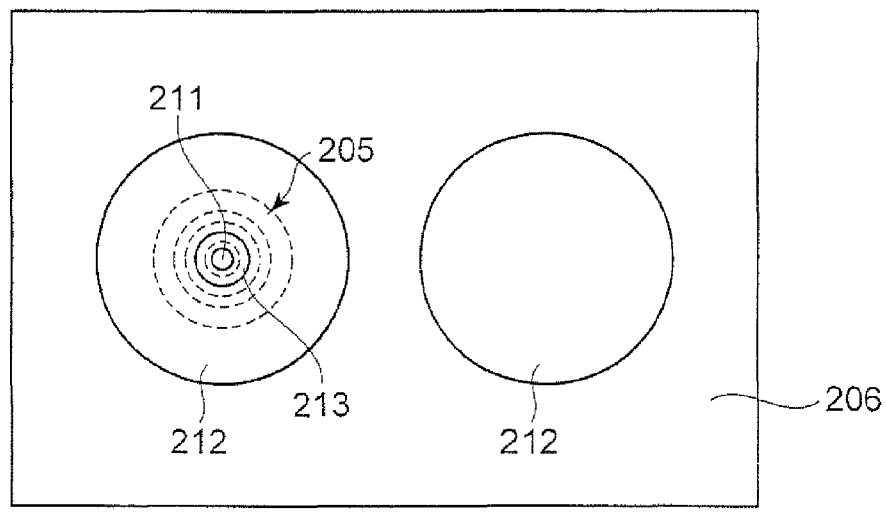
FIG. 2L is a plan view showing a state of the semiconductor device in FIG. 2M in a step of manufacturing the semiconductor device according to the first embodiment of the present invention.
Figure 2M:
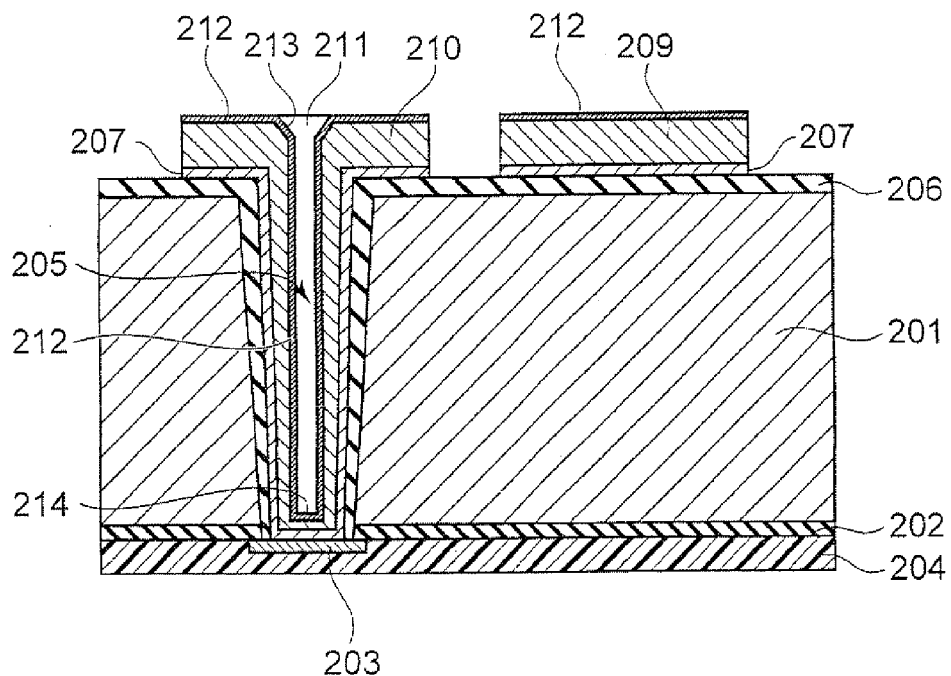
FIG. 2M is a cross-sectional view showing the state of the semiconductor device in the step of manufacturing the semiconductor device according to the first embodiment of the present invention.
Figure 2N:
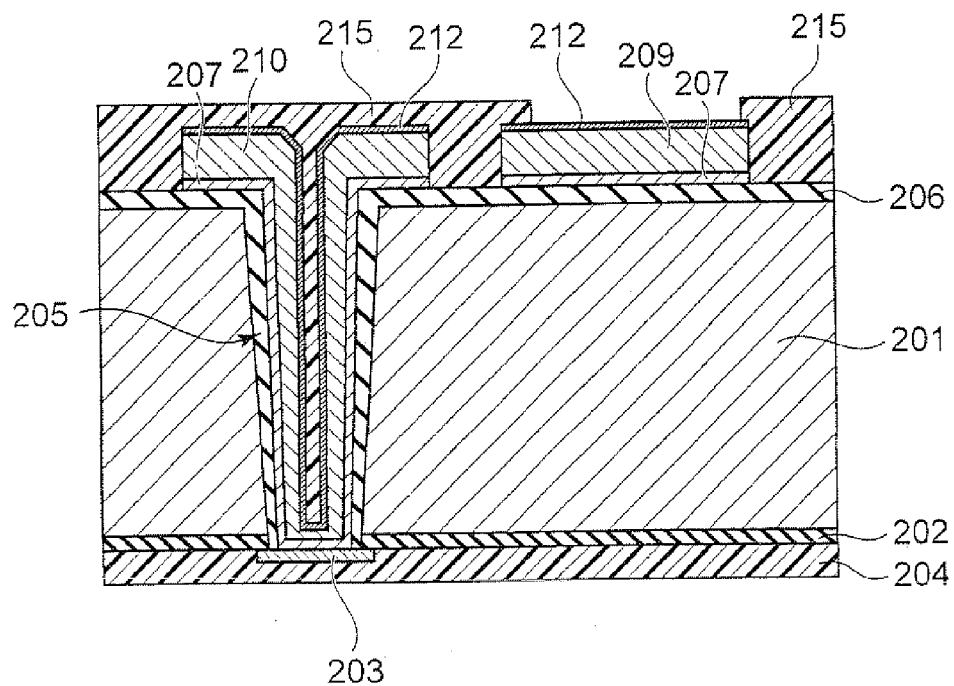
FIG. 2N is a cross-sectional view showing a state of the semiconductor device in a step of manufacturing the semiconductor device according to the first embodiment of the present invention.
Figure 2O:
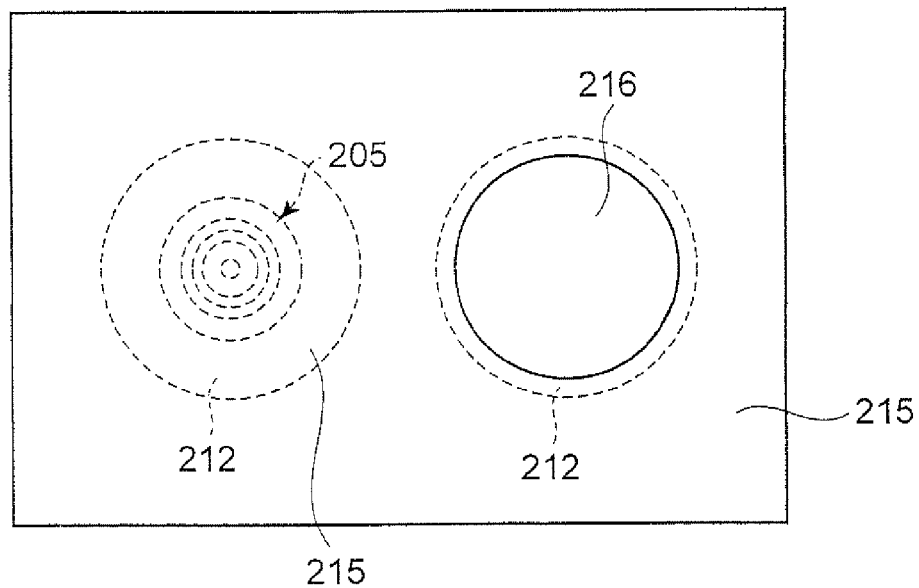
FIG. 2O is a plan view showing a state of the semiconductor device in FIG. 2P in a step of manufacturing the semiconductor device according to the first embodiment of the present invention.
Figure 2P:
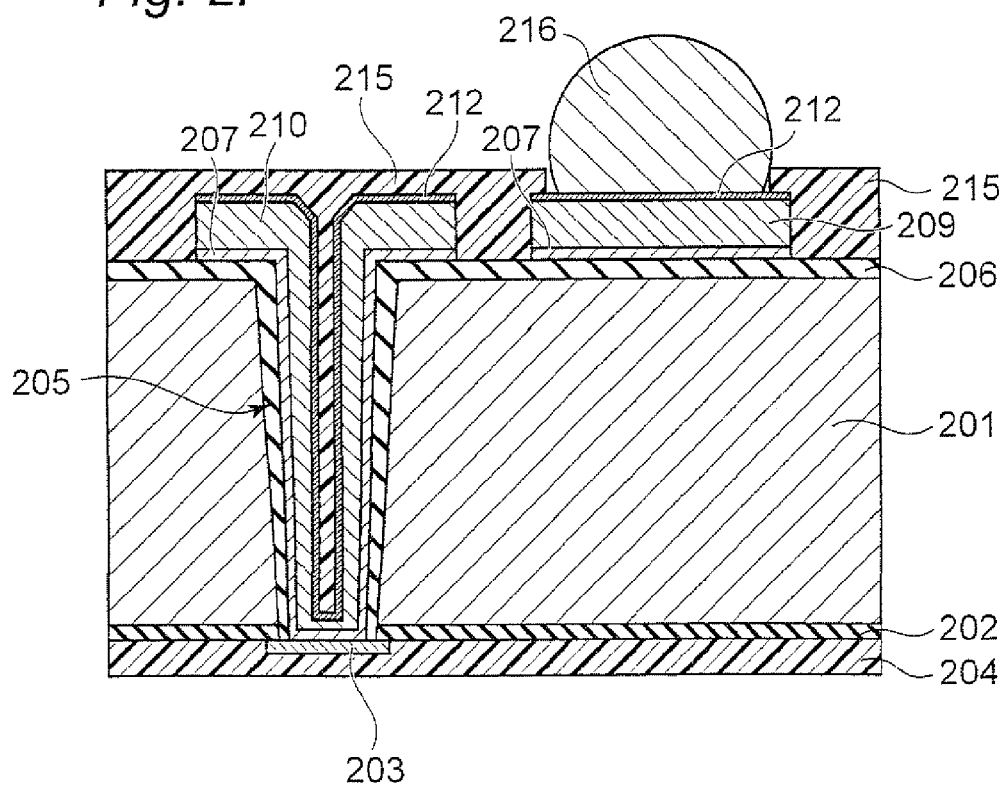
FIG. 2P is a cross-sectional view showing the state of the semiconductor device in the step of manufacturing the semiconductor device according to the first embodiment of the present invention.

FIG. 2F shows a cross-sectional state of the semiconductor device after a base conductive member 207 has been formed inside the hole section 205 and on the surface of the substrate 201 in a step (S104) in FIG. 1. The base conductive member 207 is formed so as to cover the surface of the conductive member 203 of the bottom surface 205a of the hole section 205, and the insulating film 206 remaining on the inner wall 205b of the hole section 205 and on the surface of the substrate 201.

A film of the base conductive member 207 may have a two-layer structure in which a Cu film is formed on a Ti film.

Figure 2Q:
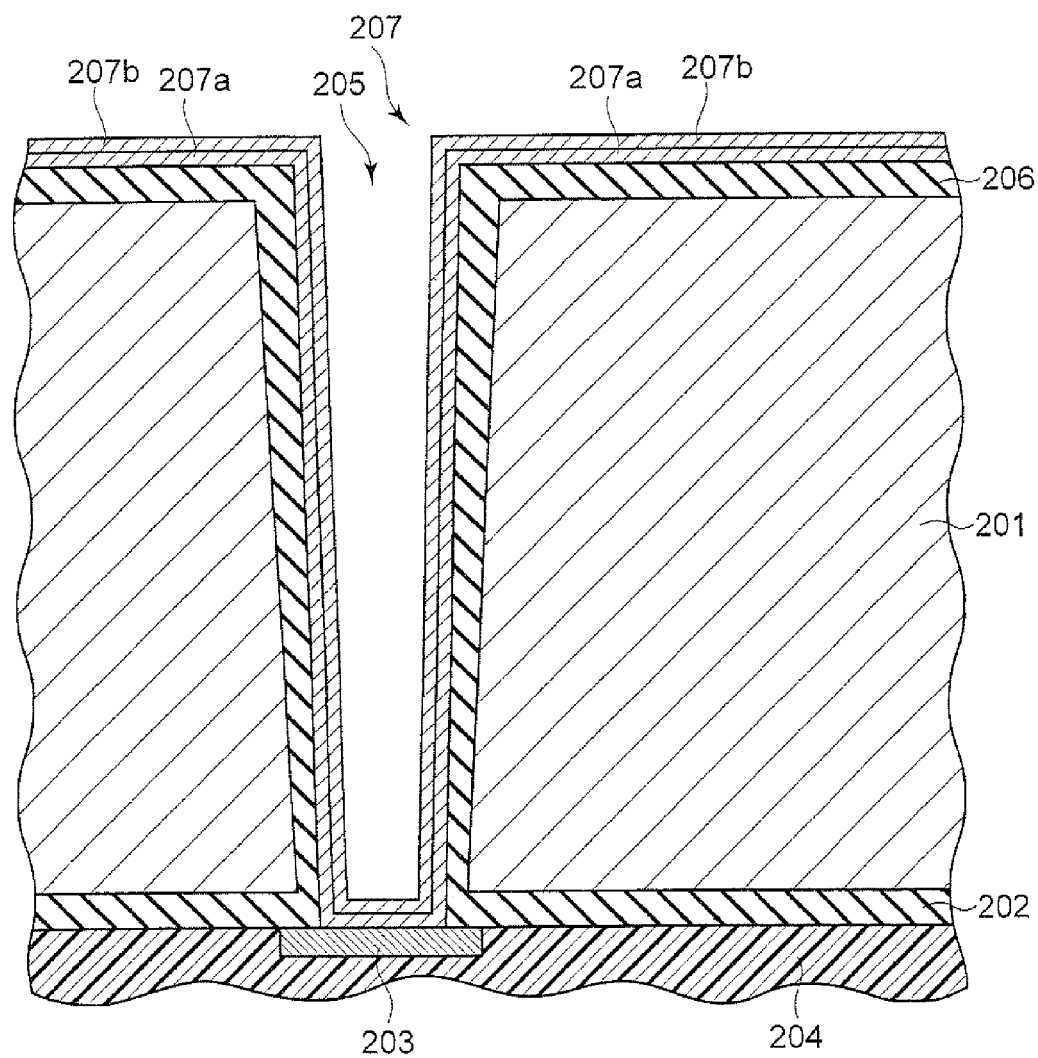
FIG. 2Q is an enlarged cross-sectional view showing a state of the semiconductor device in the step of manufacturing the semiconductor device according to the first embodiment of the present invention.
Figure 2R:
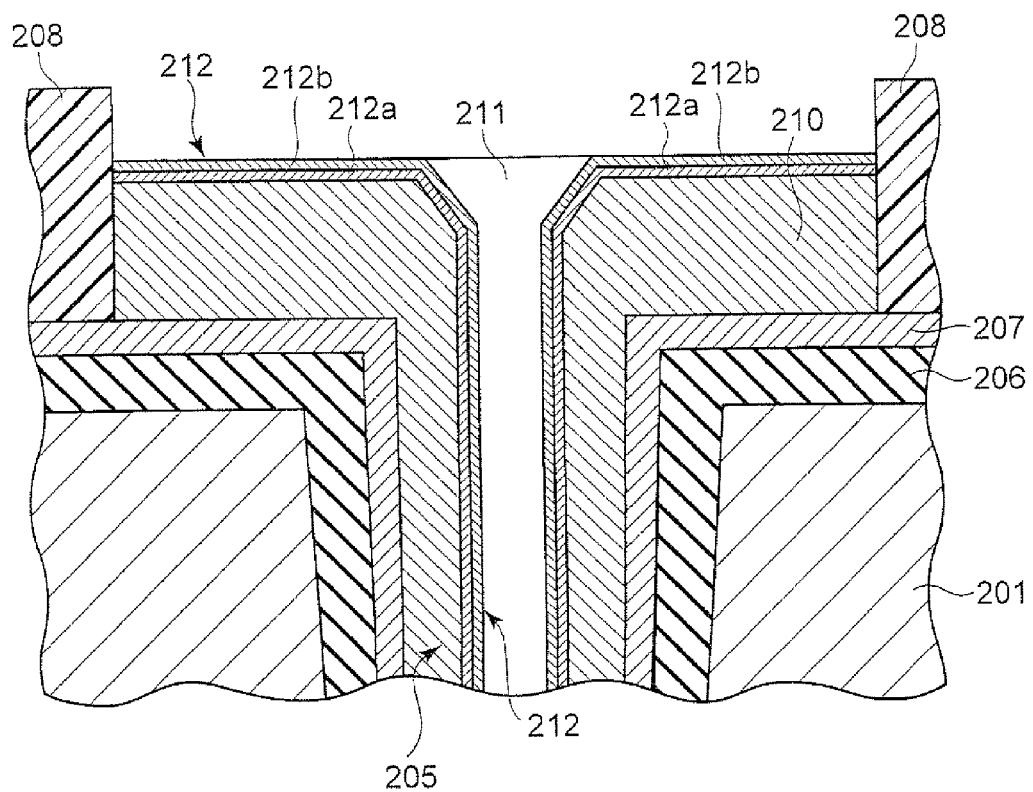
FIG. 2R is an enlarged cross-sectional view showing a two-layer structure of a mask metal by enlarging a part of FIG. 2I.

For example, according to the above working example, as shown in an expanded manner in FIG. 2Q, the film of the base conductive member 207 has the two-layer structure in which a Cu film 207b is formed on a Ti film 207a by sputtering.

The step (S104) in FIG. 1 corresponds to a step of forming the base conductive member on the surface of the substrate and in the hole section formed in the substrate according to one aspect of the present invention.

According to this first embodiment, the lower Ti film 207a of the two-layer base conductive member 207 is formed to be 1 µm in thickness on the surface of the substrate 201, formed to be 0.1 µm in thickness on the surface of the conductive member 203 of the bottom surface 205a of the hole section 205, and formed to be 0.1 µm in thickness on the inner wall 205b of the hole section 205. In addition, the upper Cu film 207b of the two-layer base conductive member 207 is formed to be 1.5 µm in thickness on the surface of the substrate 201, formed to be 0.1 µm in thickness on the surface of the conductive member 203 of the bottom surface 205a of the hole section 205, and formed to be 0.1 µm in thickness on the inner wall 205b of the hole section 205. In addition, the thicknesses of the Ti film 207a and the Cu film 207b of the base conductive member 207 are shown in an enlarged manner in FIG. 2Q to be easily understood.

The Cu film 207b formed on the Ti film 207a functions as a barrier layer to prevent the Ti film 207a from being diffused into the insulating film 206 and the substrate 201. In addition, the Cu film 207b also functions as a seed film to grow films of a first conductive layer 209 and a second conductive layer 210 in a post-step.

FIG. 2G shows a cross-sectional state of the semiconductor device after a resist 208 has been formed on the surface of the base conductive member 207 in a step (S105) in FIG. 1. The resist 208 is formed at a portion on the base conductive member 207 formed on the surface of the substrate 201 at which the first conductive layer 209 and the second conductive layer 210 are not to be formed in the next step. The resist 208 is applied and patterned to be formed on the surface of the substrate 201. As a specific example of a material of the resist 208, a novolac resin may be used. A photosensitizing agent is added in the novolac resin. In addition, as a specific example of a material of the first conductive layer 209 and the second conductive layer 210, Cu may be used.

The step (S105) in FIG. 1 corresponds to a step of forming the resist on a part of the base conductive member according to one aspect of the present invention.

In addition, a first opening 209A and a second opening 210A are openings patterned simultaneously with the resist 208 and formed. In addition, in the following description, since the first conductive layer 209 is used as an electrode pad section, the first conductive layer 209 is also called the electrode pad section 209. That is, the first conductive layer 209 and the electrode pad section 209 are the same one. The electrode pad section (first conductive layer) 209 is formed of a conductive material in the first opening 209A to form a bump in a post-step. The second conductive layer 210 is formed in the second opening 210A as will be described later. A thickness of the resist 208 is greater than a thickness of each of the first conductive layer 209 and the second conductive layer 210 formed in the next step, and it is 20 µm, as one example, in the working example of the first embodiment.

FIG. 2H shows a cross-sectional state of the semiconductor device after the first conductive layer 209 and the second conductive layer 210 have been formed on the surface of the base conductive member 207 in a step (S106 in FIG. 1. The second conductive layer 210 is a conductive layer formed on a part of the base conductive member 207 formed on the surface of the substrate 201 in which the resist 208 is not formed (that is, on the first opening 209A and the second opening 210A), and on the surface of the base conductive member 207 formed on the bottom surface 205a and the inner wall 205b of the hole section 205.

The part in which the resist 208 is not formed includes not only the part of the second opening 210A but also the part of the first opening 209A. In the part of the first opening 209A, the electrode pad section (first conductive layer) 209 is formed to form the bump in the post-step. The electrode pad section (first conductive layer) 209 and the second conductive layer 210 serving as the conductive layer are formed by plating.

The step (S106) in FIG. 1 corresponds to a step of forming the conductive layer in the part in which the resist is not formed according to one aspect of the present invention.

According to the working example of the first embodiment, the second conductive layer 210 is formed to be 10 μm in thickness on the surface of the substrate 201, formed to be 5 μm in thickness on the inner wall 205b of the hole section 205, and formed to be 2 μm in thickness on the bottom surface 205a thereof.

In addition, as the diameter of the hole section 205 decreases, the thickness of the second conductive layer 210 formed on each of the bottom surface 205a and the inner wall 205b of the hole section 205 tends to become thin. Therefore, as shown in FIG. 2H, a recessed part 211 is formed in a center of the second conductive layer 210 formed in the hole section 205 in some cases.

FIG. 2I shows a cross-sectional state of the semiconductor device after a mask metal 212 used for etching has been formed on each surface of the first conductive layer 209 and the second conductive layer 210 in a step (S107) in FIG. 1. In addition, a Ni-based Au plating is used for the mask metal 212, as one example of a metal layer which can be used as the mask metal used for etching. The mask metal 212 is formed on the second conductive layer 210. The mask metal 212 is also formed on the recessed part 211 formed in the center of the hole section 205, and on the electrode pad section (first conductive layer) 209 in which the bump is to be formed in the post-step.

The step (S107) in FIG. 1 corresponds to a step of forming the mask metal on the conductive layer after the conductive layer has been formed according to one aspect of the present invention.

According to the working example of the first embodiment, the mask metal 212 is formed by plating.

The mask metal 212 also serves as a step of forming a cap metal on the electrode pad section (first conductive layer 209) in which the bump is to be formed in the post-step, so that it is required to have solder-wettability with the bump, and resistance against a resist-removing solution in a next step and an etching solution of the base conductive member 207 in a next step. Therefore, the mask metal 212 is preferably formed of the Ni-based Au plating, for example. Because, a structure of the Ni-based Au plating is high in strength as a structure of the hole section 205, so that it is resistant to a thermal stress in a wafer treatment or in the post-step. In addition, when the Ni-based Au plating is used, the Ni-based Au-plated layer as the mask metal 212 protects the hole section 205 from the etching solution in the wet-etching step after the mask metal 212 has been formed, so that the inside of the hole section 205 can be prevented from being corroded (especially, corroded due to the etching solution), and a circuit can be formed electrically stably with high reliability.

According to the working example of the first embodiment, the mask metal 212 is formed by the Ni-based Au plating, and a Ni film thickness is 2 μm and an Au film thickness is 0.5 μm as one example. Here, the terms "mask metal 212 is formed by the Ni-based Au plating" means that, as shown in FIG. 2R, a Ni-plated base layer 212a is formed, and then, an Au-plated layer 212b is formed on the Ni-plated base layer 212a, whereby the mask metal 212 is formed.

FIGS. 2J and 2K show cross-sectional states of the semiconductor device after the resist 208 has been removed from the surface of the base conductive member 207 in a step (S108) in FIG. 1. As shown in FIG. 2K, the resist 208 formed on the base conductive member 207 is removed.

The step (S108) in FIG. 1 corresponds to a step of removing the resist according to one aspect of the present invention.

According to the first embodiment, the resist is removed with a chemical solution used for removing the resist.

FIGS. 2L and 2M show cross-sectional states of the semiconductor device after the base conductive member 207 has been removed from the insulating film surface in a step (S109) in FIG. 1. The base conductive member 207 formed on the insulating film 206 is removed by etching using the mask metal 212 as a mask.

The step (S109) in FIG. 1 corresponds to a step of etching the base conductive member using the mask metal as the mask to form the conductive layer into a predetermined shape according to one aspect of the present invention.

The base conductive member 207 is removed by wet-etching. At this time, in general, an upper corner 213 of the center recessed part 211 and a bottom surface 214 of the hole section 205 are likely to cause surface roughness due to the wet-etching solution especially. However, according to this first embodiment, since the upper corner 213 of the center recessed part 211 and the bottom surface 214 of the hole section 205 are covered with the mask metal 212, the upper corner 213 of the center recessed part 211 and the bottom surface 214 of the hole section 205 are not etched and not likely to cause the surface roughness.

FIG. 2N shows a cross-sectional state of the semiconductor device after a protective film 215 has been formed on the surface except for the electrode pad section (first conductive layer) 209 in a step (S110) in FIG. 1. The protective film 215 covers the surface except for the electrode pad section (first conductive layer) 209 in which the bump is to be formed. As a specific example of a material of the protective film 215, polyimide may be used.

FIGS. 2O and 2P show cross-sectional states of the semiconductor device after a solder bump 216 has been formed on the electrode pad section (first conductive layer) 209 in a step (S111) in FIG. 1. The solder bump 216 is a solder bump formed on the electrode pad section (first conductive layer) 209. Since the mask metal 212 exists as the cap metal (Ni-based Au-plated layer in the first embodiment) on the surface of the electrode pad section (first conductive layer) 209, it is not necessary to newly form a cap metal. Therefore, according to the first embodiment shown in FIGS. 2O and 2P, the solder bump 216 can be formed which is high in solder-wettability and high in junction strength.

According to the first embodiment of the present invention, the manufacturing steps are composed of the first step of forming the base conductive member 207 on the surface of the substrate 201 and in the hole section 205, the second step of forming the resist 208 on the base conductive member 207, the third step of forming the first conductive layer 209 and the second conductive layer 210, the fourth step of forming the mask metal 212 on the first conductive layer 209 and the second conductive layer 210 formed in the third step, the fifth step of removing the resist 208 formed in the second step, and the sixth step of etching the base conductive member 207 using the mask metal 212 as the mask to form each of the first conductive layer 209 and the second conductive layer 210 into the predetermined shape. In addition, in the second step, the resist 208 is formed in the part on the base conductive member 207 in which the first conductive layer 209 and the second conductive layer 210 are not to be formed. In the third step, the first conductive layer 209 and the second conductive layer 210 are formed in the part except for the part in which the resist 208 has been formed.

In this configuration, when the base conductive member 207 is etched to form each of the first conductive layer 209 and the second conductive layer 210 into the predetermined shape, the first conductive layer 209 and the second conductive layer 210 are not eroded due to the wet-etching solution. Therefore, according to the first embodiment, it is possible to provide the manufacturing method of the semiconductor device and to provide the semiconductor device, which can prevent quality from declining due to a resist residue without increasing the number of the steps.

In addition, according to the first embodiment, in the case where the first conductive layer 209 and the second conductive layer 210 are composed of copper (Cu), the copper (Cu) can be prevented from being oxidized by the mask metal 212 after the conductive layer has been formed. Therefore, conductivity of the first conductive layer 209 and the second conductive layer 210 can be improved. In addition, since the mask metal 212 is formed on the first conductive layer 209 and the second conductive layer 210, adhesiveness and conductivity can be improved in the first conductive layer 209 and the second conductive layer 210.

In addition, according to the first embodiment, the mask metal 212 of the Ni-based Au-plated layer can be formed without separating the base conductive member 207 and with the base conductive member 207 connected. Therefore, the Ni-based Au-plated layer can be formed by electrolytic plating as well as non-electrolytic plating. According to the conventional case, since the mask metal is not formed on the conductive layer in the hole section, and the mask metal is formed by wet-etching after wiring has been formed, only the non-electrolytic plating can be performed, and the electrolytic plating cannot be performed. Meanwhile, according to the first embodiment, since the mask metal 212 is formed by wet-etching before the wiring is formed (before wiring), the electrolytic plating can be also performed as well as the non-electrolytic plating. The electrolytic plating can speed up the step compared to the non-electrolytic plating.

(Second Embodiment)

FIG. 3 is a flowchart of steps of manufacturing a semiconductor device according to a second embodiment of the present invention. Each view shown in FIGS. 4A to 4I is a cross-sectional view or a plan view showing a state of the semiconductor device in each manufacturing step in the second embodiment. According to the second embodiment, steps until a third conductive layer 406 and a fourth conductive layer 401 are formed are the same as the steps until the first conductive layer 209 and the second conductive layer 210 are formed in the first embodiment described with reference to FIGS. 2A to 2H. In addition, in the second embodiment, the same reference numerals are allotted to the same members as those of the first embodiment, and description therefor is omitted.

Figure 4A:
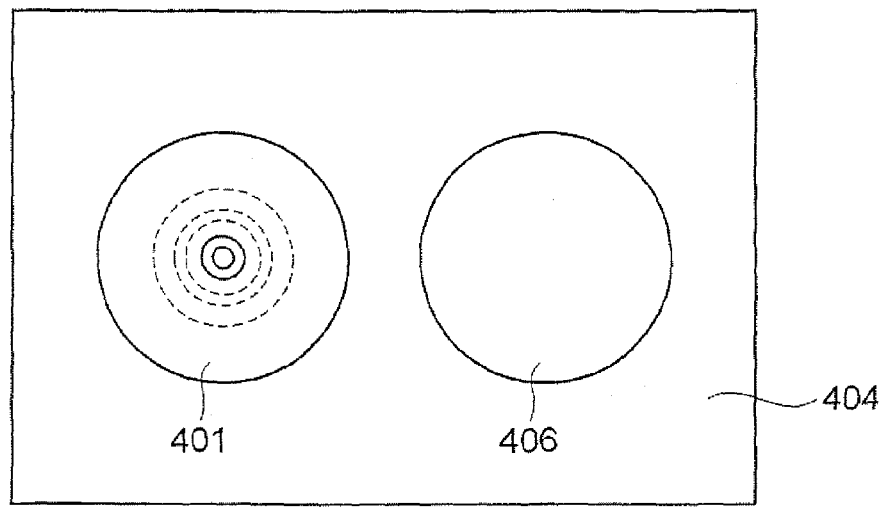
FIG. 4A is a plan view showing a state of the semiconductor device in FIG. 4B in a step of manufacturing the semiconductor device according to the second embodiment of the present invention.
Figure 4B:
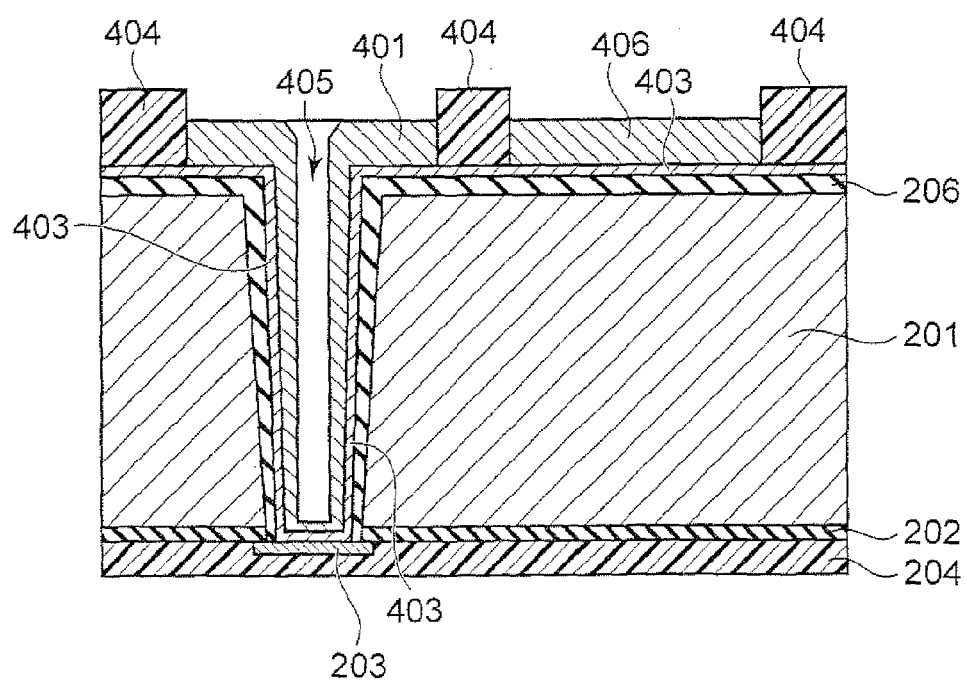
FIG. 4B is a cross-sectional view showing the state of the semiconductor device in the step of manufacturing the semiconductor device according to the second embodiment of the present invention.

FIGS. 4A and 4B show states of the semiconductor device after the two conductive layers have been formed similar to FIG. 2H. FIG. 4B shows a cross-sectional state of the semiconductor device after the third conductive layer 406 and the fourth conductive layer 401 have been formed on the surface of a base conductive member 403 in a step (S306) in FIG. 3. In addition, the base conductive member 403 corresponds to the base conductive member 207 in the first embodiment.

The step (S306) in FIG. 3 corresponds to a step of forming a conductive layer in a part in which a resist is not formed according to another aspect of the present invention.

Referring to FIGS. 4A and 4B, the fourth conductive layer 401 is a conductive layer formed in a part on the base conductive member 403 on the surface of the substrate 201 in which a resist 404 is not formed (that is, the parts corresponding to the part of the first opening 209A and the part of the second opening 210A in FIG. 2G), and on the surface of the base conductive member 403 on the bottom surface and the inner wall (the parts corresponding to the bottom surface 205a and the inner wall 205b in FIG. 2G, respectively) in a hole section 405. As a specific example of a material of the resist 404 and 407, a novolac resin may be used. A photosensitizing agent is added in the novolac resin. In addition, as a specific example of a material of the third conductive layer 406 and the fourth conductive layer 401, Cu may be used.

In addition, in the following description, since the third conductive layer 406 is used as an electrode pad section, the third conductive layer 406 is also called the electrode pad section 406. That is, the third conductive layer 406 and the electrode pad section 406 are the same one. The part in which the resist 404 is not formed includes not only the part corresponding to the part of the second opening 210A but also the part corresponding to the part of the first opening 209A in FIG. 2G. The part corresponding to the part of the first opening 209A includes the electrode pad section (third conductive layer) 406 of a conductive material on which a bump is to be formed in a post-step. The fourth conductive layer 401 and the electrode pad section (third conductive layer) 406 of the conductive material are formed by plating.

Figure 4C:
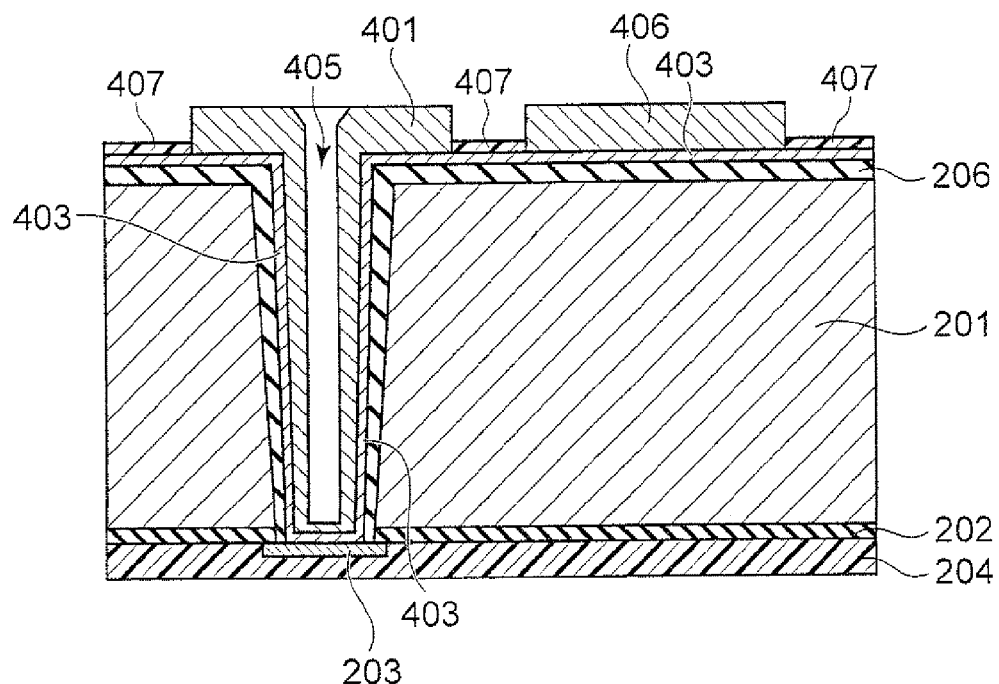
FIG. 4C is a cross-sectional view showing a state of the semiconductor device in a step of manufacturing the semiconductor device according to the second embodiment of the present invention.

FIG. 4C shows a cross-sectional state of the semiconductor device after the resist 404 on the surface of the base conductive member has been removed halfway through its thickness without being wholly removed in a step (S307) in FIG. 3. The resist 407 is a resist remaining in the form of a film on the surface of the base conductive member 403. The resist 407 is formed such that a most part of the resist 404 is removed by asking. As a specific example of a material of the resist 407, it is the same material as that of the resist 404.

The step (S307) in FIG. 3 corresponds to a halfway removing step of removing the resist halfway through its thickness after the conductive layer is formed in the part in which the resist is not formed, before the mask metal is formed on the conductive layer according to another aspect of the present invention.

The residual resist 407 may have a thickness to the extent that the surface of the base conductive member 403 is protected so that a mask metal is not formed thereon in a next step of forming the mask metal. The thickness of the residual resist 407 is preferably as small as possible.

For example, according to a working example of the second embodiment, the resist 404 is thinned from an initial thickness 20 μm by a thickness 19 μm through ashing, so that the resist 407 has a thickness of 1 μm.

Figure 4D:
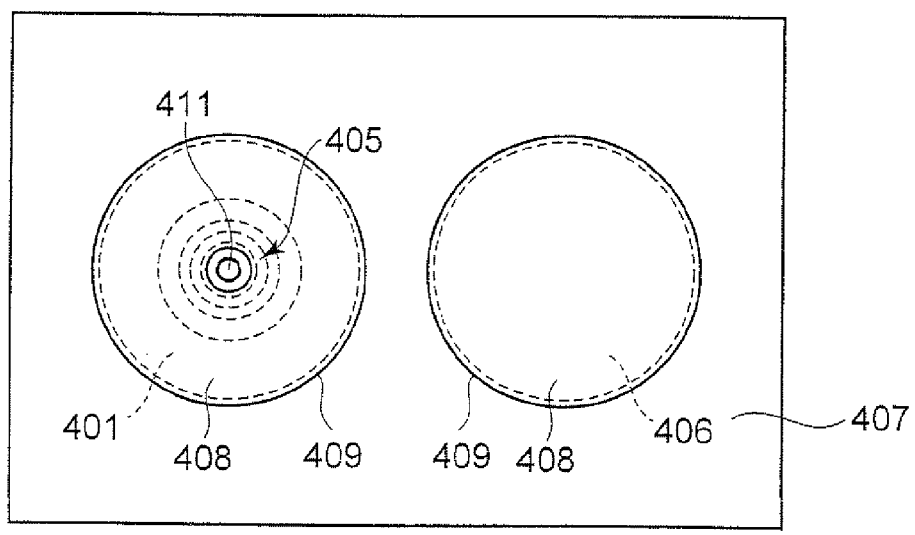
FIG. 4D is a plan view showing a state of the semiconductor device in FIG. 4E in a step of manufacturing the semiconductor device according to the second embodiment of the present invention.
Figure 4E:
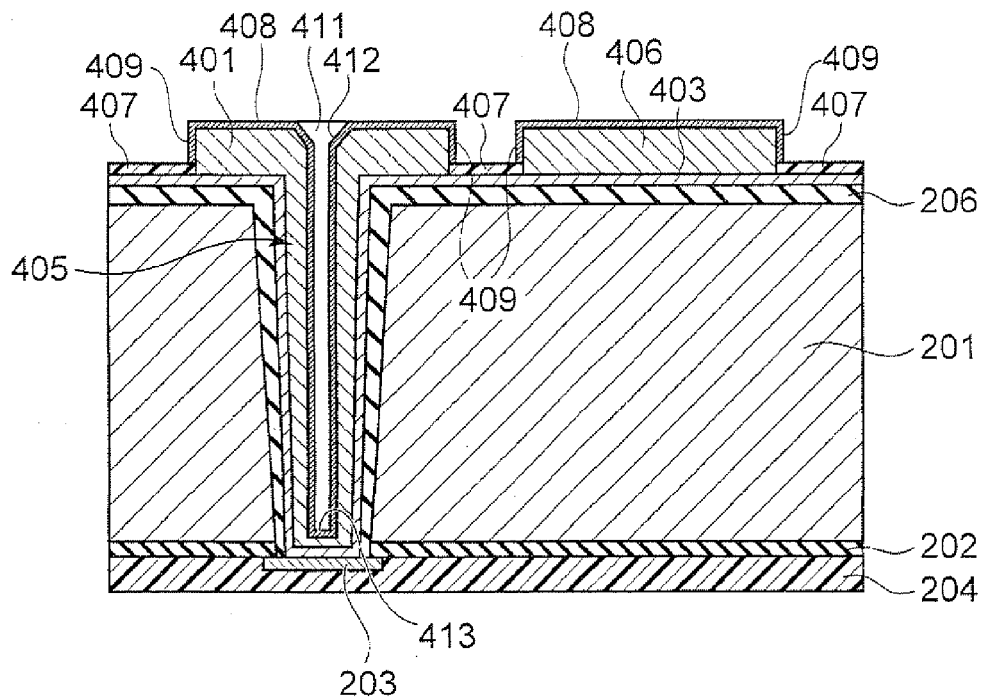
FIG. 4E is a cross-sectional view showing the state of the semiconductor device in the step of manufacturing the semiconductor device according to the second embodiment of the present invention.

FIGS. 4D and 4E show cross-sectional states of the semiconductor device after a mask metal 408 used for etching has been formed on surfaces and end faces 409 of side surfaces of the third conductive layer 406 and the fourth conductive layer 401 in a step (S308) in FIG. 3. In addition, a Ni-based Au plating is used for the mask metal 408, as one example of a metal layer which can be used as mask metal used for etching. The mask metal 408 is a mask metal formed on the third conductive layer 406 and the fourth conductive layer 401. The mask metal 408 is also formed on a recessed part 411 formed in a center of the hole section 405, on the electrode pad section (third conductive layer) 406 in which the bump is to be formed in the post-step, and on the end face 409 of the side of the electrode pad section (third conductive layer) 406 composed of the conductive material which has been exposed due to the removal of the resist in the halfway removing step.

The step (S308) in FIG. 3 corresponds to a step of forming the mask metal on the conductive layer after the conductive layer has been formed according to another aspect of the present invention.

According to the second embodiment, the mask metal 408 is formed by plating.

The mask metal 408 also serves as a step of forming a cap metal on the electrode pad section (third conductive layer) 406 of the conductive layer in which the bump is to be formed in the post-step. Thus, the mask metal 408 is required to have solder-wettability with the bump, and resistance against a resist-removing solution in a next step and an etching solution of the base conductive member 403 in a next step. Therefore, the mask metal 408 is preferably formed of the Ni-based Au plating, for example. Because, a structure of the Ni-based Au plating is high in strength as a structure of the hole section 405, so that the structure of the Ni-based Au plating is resistant to a thermal stress in a wafer treatment or in the post-step. In addition, when the Ni-based Au plating is used, a Ni-based Au-plated layer as the mask metal 408 protects the hole section 405 from the etching solution in the wet-etching step after the mask metal 408 has been formed, so that the inside of the hole section 405 can be prevented from being corroded (especially, corroded due to the etching solution), and a circuit can be formed electrically stably with high reliability.

According to the working example of the second embodiment, the mask metal 408 is formed by the Ni-based Au plating, and a Ni film thickness is 2 μm and an Au film thickness is 0.5 μm as one example. Here, the terms "mask metal 408 is formed by the Ni-based Au plating" means that, as shown in FIG. 4J, a Ni-plated base layer 408a is formed, and then, an Au-plated layer 408b is formed on the Ni-plated base layer 408a, whereby the mask metal 408 is formed.

Figure 4F:
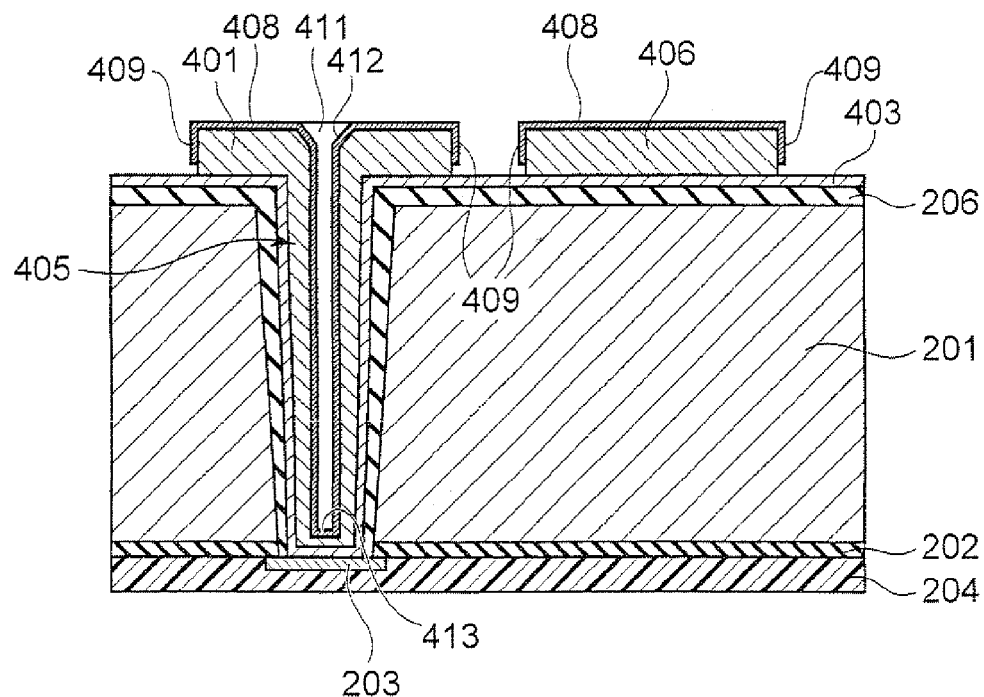
FIG. 4F is a cross-sectional view showing a state of the semiconductor device in a step of manufacturing the semiconductor device according to the second embodiment of the present invention.

FIG. 4F shows a cross-sectional state of the semiconductor device after the resist 407 on the surface of the base conductive member 403 has been removed in a step (S309) in FIG. 3. As shown in FIG. 4F, the resist 407 left on the base conductive member 403 is completely removed.

The step (S309) in FIG. 3 corresponds to a step of removing the resist according to another aspect of the present invention.

According to the second embodiment, the resist 407 is removed with a chemical solution used for removing the resist.

Figure 4G:
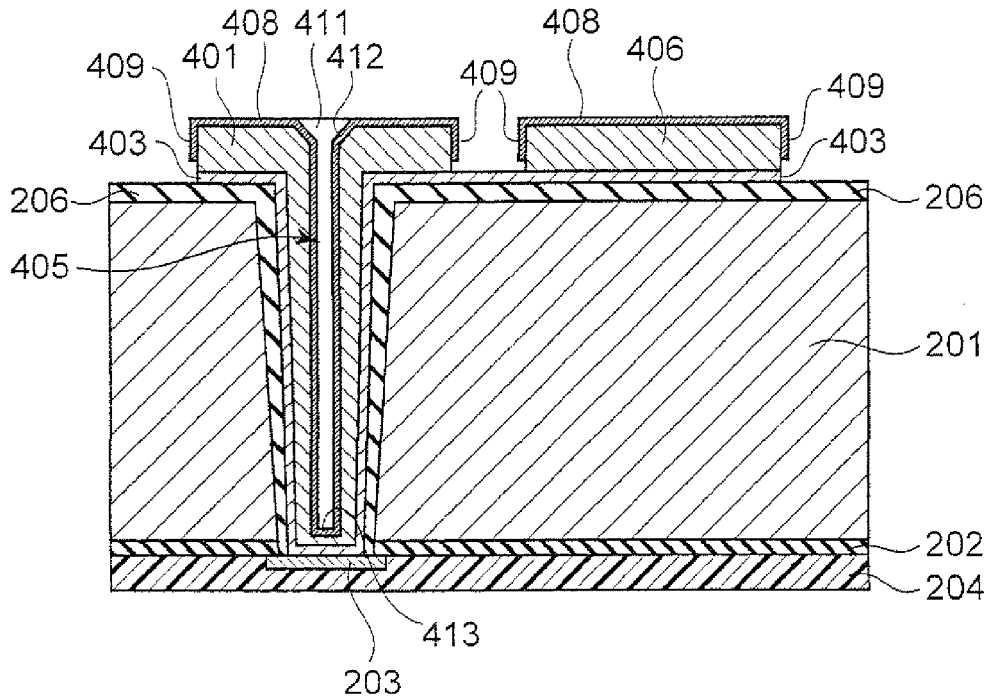
FIG. 4G is a cross-sectional view showing a state of the semiconductor device in a step of manufacturing the semiconductor device according to the second embodiment of the present invention.

FIG. 4G shows a cross-sectional state of the semiconductor device after the base conductive member 403 has been removed from the insulating film surface in a step (S310) in FIG. 3. The base conductive member 403 formed on the insulating film 206 is removed by etching using the mask metal 408 as a mask.

The step (S310) in FIG. 3 corresponds to a step of etching the base conductive member using the mask metal as the mask to form the conductive layer into a predetermined shape according to another aspect of the present invention.

The base conductive member 403 is removed by wet-etching. At this time, in general, an upper corner 412 of the center recessed part 411 and a bottom surface 413 of the hole section 405 are likely to cause surface roughness due to the wet-etching solution especially. However, according to this second embodiment, since the upper corner 412 of the center recessed part 411 and the bottom surface 413 of the hole section 405, and the end face 409 of the side part of the electrode pad section (third conductive layer) 406 are covered with the mask metal 408, they are not etched and not likely to cause the surface roughness.

Figure 4H:
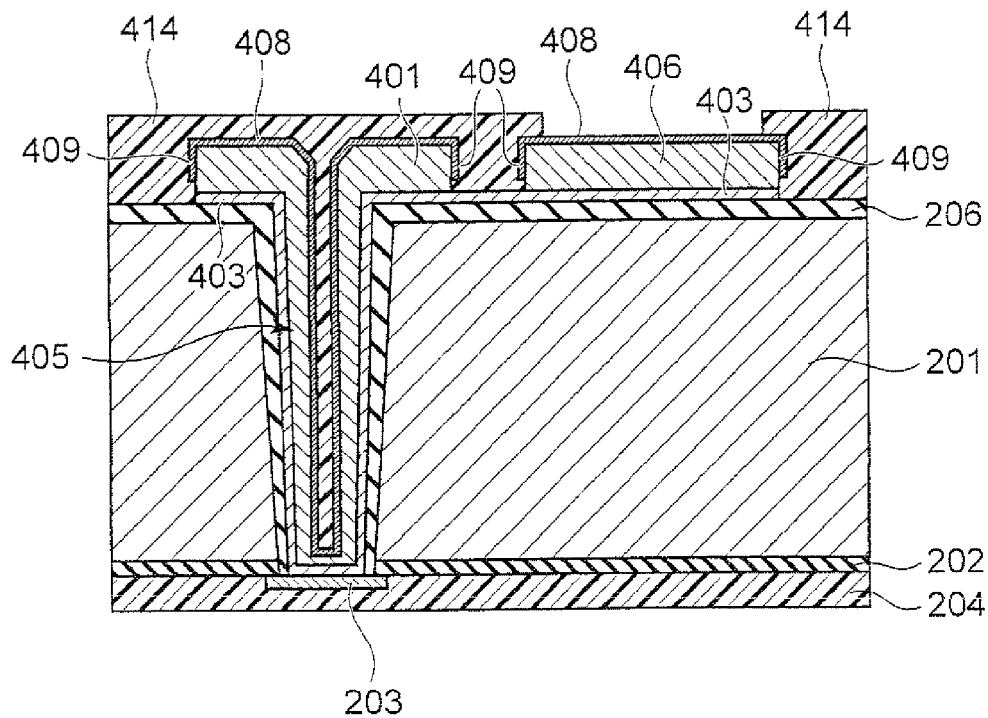
FIG. 4H is a cross-sectional view showing a state of the semiconductor device in a step of manufacturing the semiconductor device according to the second embodiment of the present invention.

FIG. 4H shows a cross-sectional state of the semiconductor device after a protective film 414 has been formed on the surface except for the electrode pad section (third conductive layer) 406 in a step (S311) in FIG. 3. The protective film 414 is a protective film that covers the surface except for the electrode pad section (third conductive layer) 406 in which the bump is to be formed. As a specific example of a material of the protective film 414, polyimide may be used.

Figure 4I:
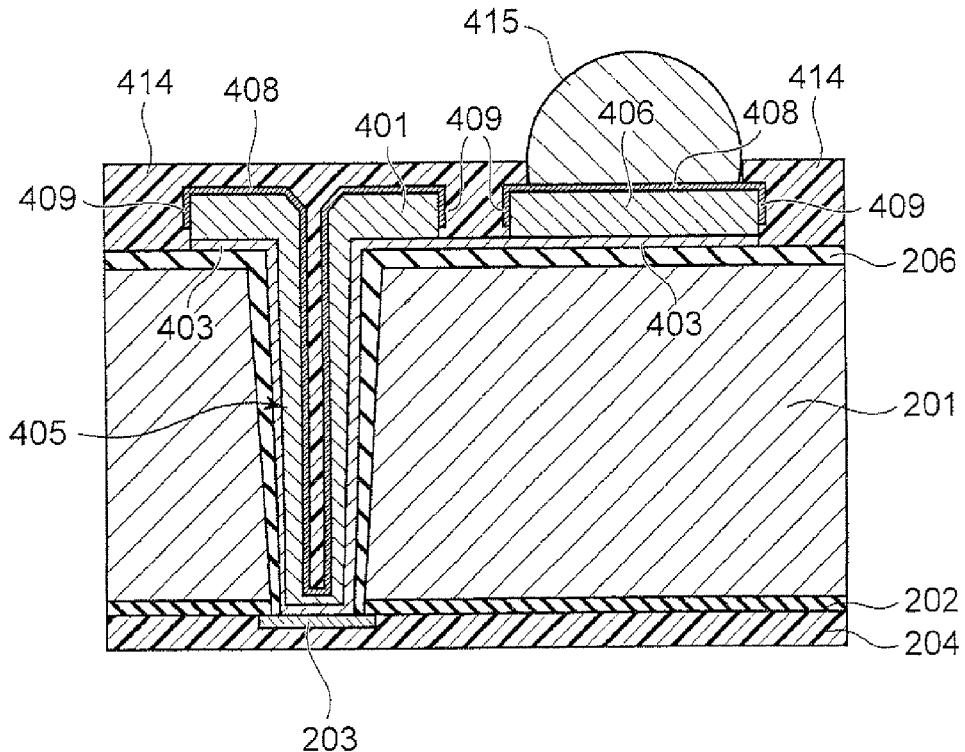
FIG. 4I is a cross-sectional view showing a state of the semiconductor device in a step of manufacturing the semiconductor device according to the second embodiment of the present invention.
Figure 4J:
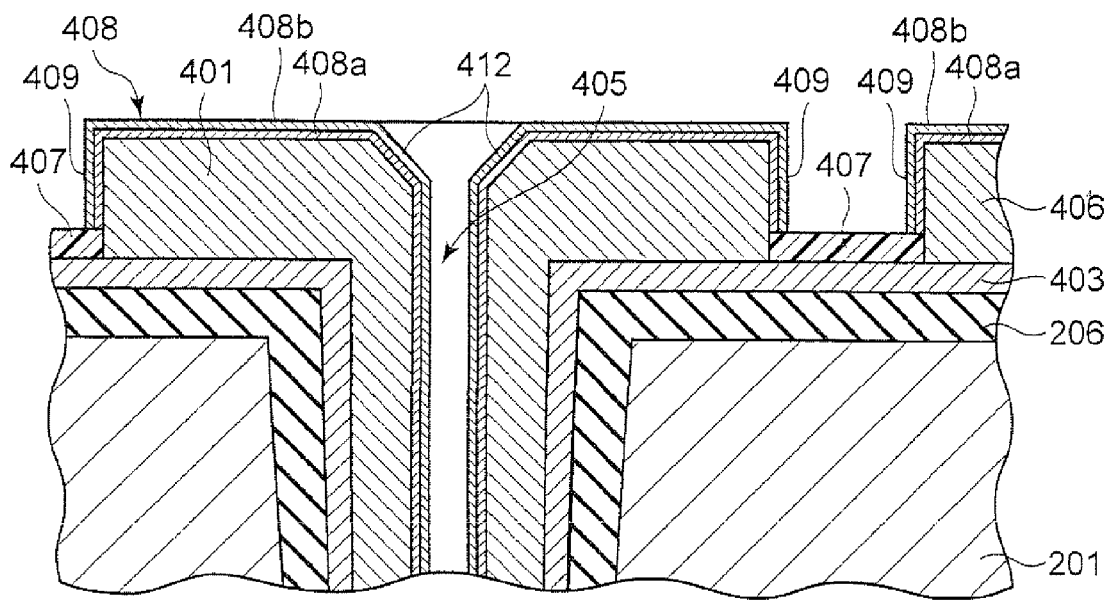
FIG. 4J is an enlarged cross-sectional view showing a two-layer structure of a mask metal by enlarging a part of FIG. 4E.
Figure 5:
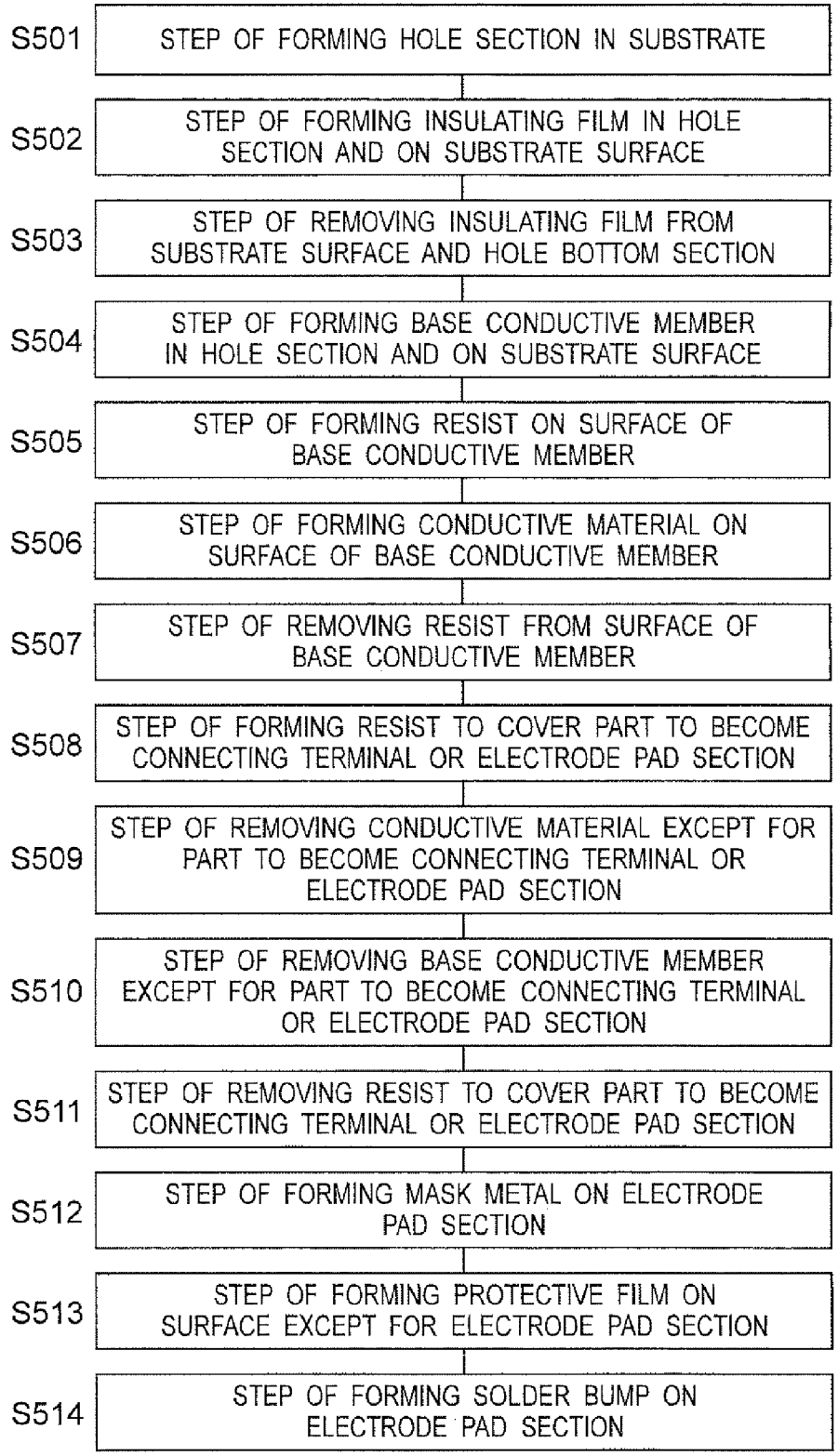
FIG. 5 is a flowchart of conventional semiconductor device manufacturing steps.
Figure 6A:
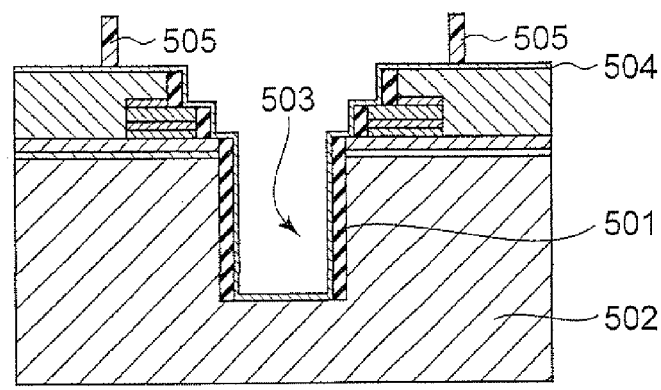
FIG. 6A is a cross-sectional view showing a state of the semiconductor device in a step of the conventional manufacturing method of the semiconductor device.
Figure 6B:
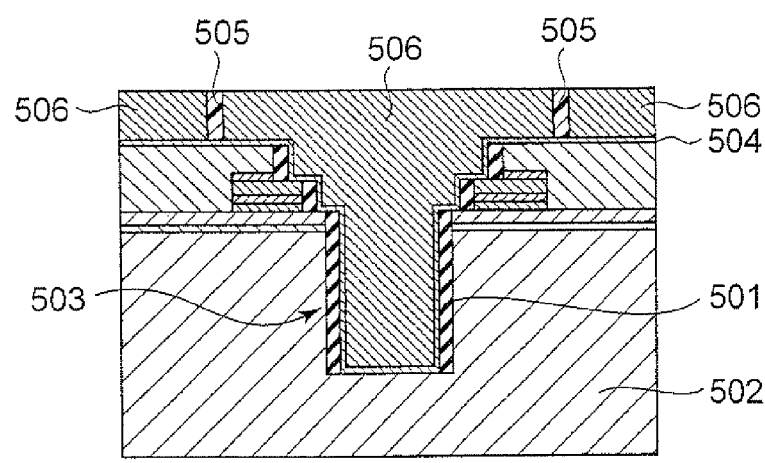
FIG. 6B is a cross-sectional view showing a state of the semiconductor device in a step of the conventional manufacturing method of the semiconductor device.
Figure 6C:
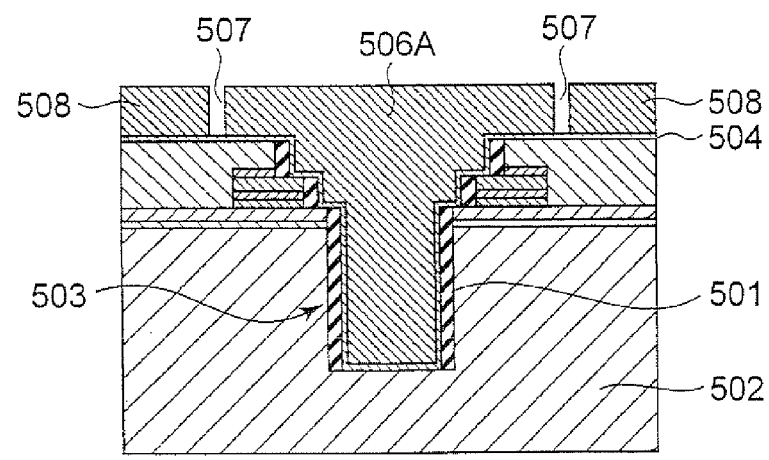
FIG. 6C is a cross-sectional view showing a state of the semiconductor device in a step of the conventional manufacturing method of the semiconductor device.
Figure 6D:
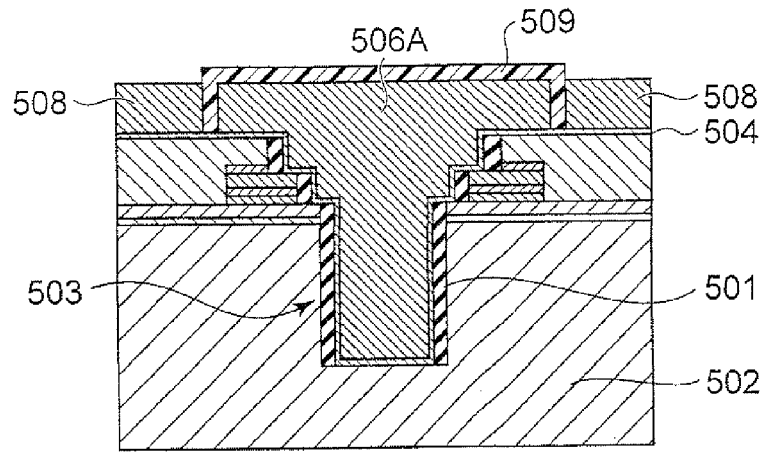
FIG. 6D is a cross-sectional view showing a state of the semiconductor device in a step of the conventional manufacturing method of the semiconductor device.
Figure 6E:
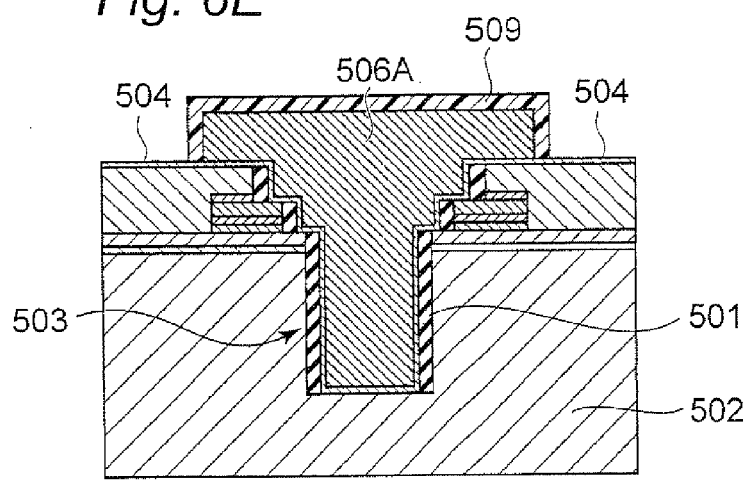
FIG. 6E is a cross-sectional view showing a state of the semiconductor device in a step of the conventional manufacturing method of the semiconductor device.
Figure 6F:
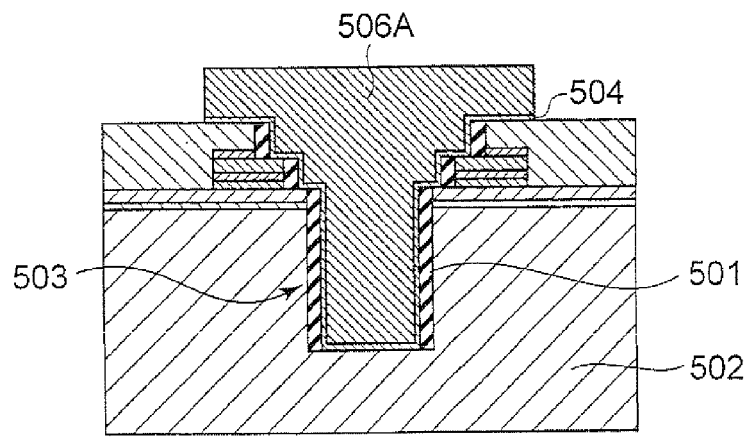
FIG. 6F is a cross-sectional view showing a state of the semiconductor device in a step of the conventional manufacturing method of the semiconductor device.

FIG. 4I shows a cross-sectional state of the semiconductor device after a solder bump 415 has been formed on the electrode pad section (third conductive layer) 406 in a step (S312) in FIG. 3. The solder bump 415 is formed on the electrode pad section (third conductive layer) 406. Since the mask metal 408 exists as the cap metal (Ni-based Au-plated layer in the second embodiment) on the surface of the electrode pad section (third conductive layer) 406, it is not necessary to newly form a cap metal. Therefore, according to the second embodiment, the solder bump 415 can be formed which is high in solder-wettability and high in junction strength.

According to the second embodiment, the halfway removing step of removing the resist 404 halfway through its thickness and leaving one part of it as the resist 407 is included between the third step and the fourth step in the first embodiment. Since this halfway removing step is included, in addition to the surfaces of the fourth conductive layer 401 and the third conductive layer (electrode pad section) 406, the end faces 409 of the third conductive layer 406 and the fourth conductive layer 401 are also covered with the mask metal 408. Therefore, even in a case where the thickness of each of the third conductive layer 406 and the fourth conductive layer 401 is thick (for example, in a case where each thickness of the third conductive layer 406 and the fourth conductive layer 401 is about twice as thick as a normal thickness of 5 to 10 μm), the third conductive layer 406 and the fourth conductive layer 401 are prevented from being eroded by a wet-etching solution when the base conductive member 403 is etched to form each of the third conductive layer 406 and the fourth conductive layer 401 into the predetermined shape. Thus, it is possible to provide the manufacturing method of the semiconductor device and to provide the semiconductor device, which can prevent quality from declining due to a resist residue without increasing the number of the steps.

In addition, when the protective film 414 is formed, it is heated to 200° C. and cured, so that Cu, as one example, used to form the third conductive layer 406 and the fourth conductive layer 401 is recrystallized and at that time, contraction is generated and a residual stress could be generated between the third conductive layer 406 and the fourth conductive layer 401. Meanwhile, in the case where the surfaces and the sides of the third conductive layer 406 and the fourth conductive layer 401 are covered with the mask metal 408, the heat at 200° C. generated to cure for forming the protective film 414 is reflected by the mask metal 408 so that the heat is prevented from being directly transferred to the third conductive layer 406 and the fourth conductive layer 401. Thus, since the heat is prevented from being directly transferred to the third conductive layer 406 and the fourth conductive layer 401, recrystallization of Cu can be prevented in some degree, so that the residual stress can be prevented from being generated between the third conductive layer 406 and the fourth conductive layer 401.

In addition, according to the second embodiment, in the case where the third conductive layer 406 and the fourth conductive layer 401 are composed of copper (Cu), the copper (Cu) can be prevented from being oxidized by the mask metal 408 after the conductive layer has been formed. Therefore, conductivity of the third conductive layer 406 and the fourth conductive layer 401 can be improved. In addition, since the mask metal 408 is formed on the third conductive layer 406 and the fourth conductive layer 401, adhesiveness and conductivity can be improved in the third conductive layer 406 and the fourth conductive layer 401.

In addition, according to the second embodiment also, the mask metal 408 of the Ni-based Au-plated layer can be formed without separating the base conductive member 403 and with the base conductive member 403 connected. Therefore, the Ni-based Au-plated layer can be formed by electrolytic plating as well as non-electrolytic plating. In addition, according to the conventional case, since the mask metal is not formed on the conductive layer in the hole section, and the mask metal is formed by wet-etching after the wiring has been formed, only the non-electrolytic plating can be performed, and the electrolytic plating cannot be performed. Meanwhile, according to the second embodiment, the mask metal 408 is formed by wet-etching before wiring is formed (before wiring), so that the electrolytic plating can be also performed as well as the non-electrolytic plating. The electrolytic plating can speedup the step compared to the non-electrolytic plating.

In addition, by properly combining arbitrary embodiments or modifications of the aforementioned various embodiments or modifications, the effects owned by each of them can be made effectual.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

INDUSTRIAL APPLICABILITY

The manufacturing method of the semiconductor device and the semiconductor device according to the present invention can be applied to three-dimensional packaging to connect semiconductor chips or a semiconductor chip and a substrate, or packaging of an electronic component.

The invention claimed is:

1. A semiconductor device manufacturing method comprising:

forming a base conductive member on a surface of a substrate, and in a hole section formed in the substrate;

forming a resist on a part of the base conductive member;

removing the resist halfway through its thickness, after forming a conductive layer on a part except for a part at which the resist is formed and before forming the mask metal on the conductive layer;

forming a mask metal on the conductive layer with a surface of the conductive layer protected by the resist removed halfway;

removing the resist removed halfway after forming the mask metal; and etching the base conductive member using the mask metal as a mask to form the conductive layer into a predetermined shape.

2. The semiconductor device manufacturing method according to claim 1, comprising:

forming the conductive layer on a side wall and a bottom surface in the hole section formed in the substrate when forming the conductive layer on the part except for the part at which the resist is formed; and forming the mask metal on the conductive layer formed on the side wall and the bottom surface in the hole section when forming the mask metal on the conductive layer.

3. The semiconductor device manufacturing method according to claim 1, comprising:

forming a cap metal on an electrode pad section composed of the conductive layer when forming the mask metal.

4. The semiconductor device manufacturing method according to claim 1, wherein the mask metal is composed of a Ni base layer and an Au layer formed on the base layer.

* * * * *

UNITED STATES PATENT AND TRADEMARK OFFICE
CERTIFICATE OF CORRECTION

PATENT NO.         : 8,349,736 B2
APPLICATION NO.    : 13/384015
DATED              : January 8, 2013
INVENTOR(S)        : Isao Muragishi It is certified that error appears in the above-identified patent and that said Letters Patent is hereby corrected as shown below:

Title Page:

In item (75), "Kai Takayuki" should read --Takayuki Kai--.

In item (75), "Saito Daishiro" should read --Daishiro Saito--.

Signed and Sealed this
Eleventh Day of June, 2013

Teresa Stanek Rea
*Acting Director of the United States Patent and Trademark Office*